United States Patent
Fukui et al.

(10) Patent No.: US 12,163,087 B2
(45) Date of Patent: *Dec. 10, 2024

(54) SURFACE TREATMENT AGENT AND METHOD FOR MANUFACTURING SURFACE TREATMENT BODY

(71) Applicant: Central Glass Company, Limited, Ube (JP)

(72) Inventors: Yuki Fukui, Ube (JP); Yuzo Okumura, Ube (JP); Yoshiharu Terui, Ube (JP); Soichi Kumon, Matsusaka (JP)

(73) Assignee: Central Glass Company, Limited, Ube (JP)

( * ) Notice: Subject to any disclaimer, the term of this patent is extended or adjusted under 35 U.S.C. 154(b) by 571 days.

This patent is subject to a terminal disclaimer.

(21) Appl. No.: 17/595,797

(22) PCT Filed: Jun. 4, 2020

(86) PCT No.: PCT/JP2020/022031
§ 371 (c)(1),
(2) Date: Nov. 24, 2021

(87) PCT Pub. No.: WO2020/255725
PCT Pub. Date: Dec. 24, 2020

(65) Prior Publication Data
US 2022/0325156 A1    Oct. 13, 2022

(30) Foreign Application Priority Data
Jun. 21, 2019   (JP) ................................. 2019-115096

(51) Int. Cl.
*G03F 7/40*    (2006.01)
*C09D 183/08*   (2006.01)
(Continued)

(52) U.S. Cl.
CPC .............. *C09K 3/18* (2013.01); *C09D 183/08* (2013.01); *G03F 7/40* (2013.01); *H01L 21/3105* (2013.01)

(58) Field of Classification Search
None
See application file for complete search history.

(56) References Cited

U.S. PATENT DOCUMENTS

| 2011/0054184 A1 | 3/2011 | Yoshida et al. |
| 2017/0088722 A1 | 3/2017 | Mori et al. |
| 2019/0341246 A1 | 11/2019 | Okumura et al. |

FOREIGN PATENT DOCUMENTS

| JP | 2017-63179 A | 3/2017 |
| JP | 2018-137426 A | 8/2018 |

(Continued)

OTHER PUBLICATIONS

Extended European Search Report issued in European Application No. 20825525.7 dated Jul. 4, 2022 (six (6) pages).

(Continued)

*Primary Examiner* — Coris Fung
*Assistant Examiner* — Keling Zhang
(74) *Attorney, Agent, or Firm* — Crowell & Moring LLP

(57) ABSTRACT

Please substitute the new Abstract submitted herewith for the original Abstract: The present disclosure provides a surface treatment agent capable of not only being prepared by dissolving raw materials in a short time but also exerting a good water repellency imparting effect, and a method for manufacturing a surface treated body with the use of the surface treatment agent. The surface treatment agent according to the present disclosure includes the following components: (I) at least one kind selected from the group consisting of silicon compounds represented by the following formulas (Continued)

(1) and (2); (II) at least one kind selected from the group consisting of a nitrogen-containing heterocyclic compound represented by the following general formula (3), a nitrogen-containing heterocyclic compound represented by the following general formula (4) and imidazole; (III) an organic solvent; and (IV) at least one kind selected from the group consisting of silicon compounds represented by the following formulas (5) and (6).

$(R^1)_a(H)_b Si[N(R^2)C(=O)R^3]_{4-a-b}$ (1)

$(R^4)_c(H)_d Si[OC(R^5)=NSi(R^6)_e(H)_{3-e}]_{4-c-d}$ (2)

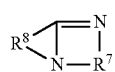

(3)

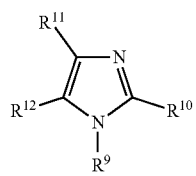

(4)

$(R^{13})_f(H)_g Si[OC(=O)R^{14}]_{4-f-g}$ (5)

$(R^{15})_h(H)_i SiX_{4-h-i}$ (6)

18 Claims, 1 Drawing Sheet

(51) Int. Cl.
*C09K 3/18* (2006.01)
*H01L 21/3105* (2006.01)

(56) References Cited

FOREIGN PATENT DOCUMENTS

WO  WO 2018/193841 A1  10/2018
WO  WO 2019/124264 A1  6/2019

OTHER PUBLICATIONS

International Search Report (PCT/ISA/210) issued in PCT Application No. PCT/JP2020/022031 dated Sep. 1, 2020 with English translation (four (4) pages).
Japanese-language Written Opinion (PCT/ISA/237) issued in PCT Application No. PCT/JP2020/022031 dated Sep. 1, 2020 (four (4) pages).

SURFACE TREATMENT AGENT AND METHOD FOR MANUFACTURING SURFACE TREATMENT BODY

FIELD OF THE INVENTION

The present disclosure relates to a surface treatment agent and a method for manufacturing a surface treated body. More particularly, the present disclosure relates to a surface treatment agent suitably applicable for surface treatment of workpieces, such as substrates used for manufacturing of semiconductor integrated circuits, and a method for manufacturing a surface treated body.

BACKGROUND ART

In the manufacturing of semiconductor devices and the like, it is common practice to use a lithographic technique before performing processing treatment such as etching on substrates. In the lithographic technique, a resin pattern is provided on a substrate by forming a photosensitive resin layer from a photosensitive resin composition on the substrate, selectively exposing the photosensitive resin layer to active radiation, developing the exposed photosensitive resin layer and selectively dissolving and removing the developed photosensitive resin layer. Then, an inorganic pattern is formed on the surface by performing an etching process with the use of the resin pattern as a mask.

With the recent increasing tendency toward the high integration and miniaturization of semiconductor devices, the resin pattern used as the mask and the inorganic pattern formed by the etching process are being made finer and higher in aspect ratio. On the other hand, the occurrence of so-called pattern collapse is becoming a problem. The pattern collapse is a phenomenon in which, when a plurality of resin pattern traces or inorganic pattern traces are formed side by side on a substrate, adjacent ones of the pattern traces lean against each other and, in some cases, become broken or separated from their bases. The occurrence of such pattern collapse makes it impossible to obtain a desired product and thus leads to a deterioration in the manufacturing yield and reliability of the product.

It is known that pattern collapse occurs, during a cleaning process with a cleaning liquid after the formation of the pattern, due to a surface tension of the cleaning liquid caused by drying of the cleaning liquid. More specifically, when the cleaning liquid is removed during the drying step, a stress is exerted between pattern traces due to surface tension of the cleaning liquid whereby the pattern collapse occurs under the action of such a stress.

Hence, Patent Document 1 discloses a technique of, for the purpose of preventing a pattern collapse in an inorganic pattern or resin pattern on a substrate, performing surface treatment on the workpiece (that is, the pattern on the substrate) with the use of a surface treatment liquid including a silylation reagent and a silicon-free nitrogen-containing heterocyclic compound and thereby imparting water repellency to the workpiece.

PRIOR ART DOCUMENTS

Patent Documents

Patent Document 1: Japanese Laid-Open Patent Application Publication No. 2017-063179

SUMMARY OF THE INVENTION

The present inventors have found that, in the case of using the surface treatment liquid containing the silylation agent and the nitrogen-containing heterocyclic compound with no silicon atom, there may arises a problem that it takes time to dissolve the raw materials for preparation of the surface treatment liquid or a problem that the surface treatment liquid may not exert a sufficient water repellency imparting effect.

It is accordingly an object of the present disclosure to provide a novel surface treatment agent capable of solving the above-mentioned problems.

A first aspect of the present disclosure is directed to a surface treatment agent for surface treatment of a workpiece, comprising:

(I) at least one kind selected from the group consisting of silicon compounds represented by the following general formulas [1] and [2];

(II) at least one kind selected from the group consisting of a nitrogen-containing heterocyclic compound represented by the following general formula [3], a nitrogen-containing heterocyclic compound represented by the following general formula [4] and imidazole;

(III) an organic solvent; and (IV) at least one kind selected from the group consisting of silicon compounds represented by the following general formulas [5] and [6].

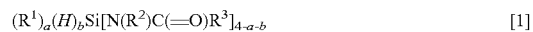  [1]

In the general formula [1], $R^1$ is each independently a $C_1$-$C_{18}$ monovalent hydrocarbon group in which a part or all of hydrogen atoms may be substituted by a fluorine atom; $R^2$ is each independently a group selected from the group consisting of a $C_1$-$C_6$ alkyl group in which a part or all of hydrogen atoms may be substituted by a fluorine atom, and a hydrogen atom; $R^3$ is each independently a $C_1$-$C_6$ alkyl group in which a part or all of hydrogen atoms may be substituted by a fluorine atom; a is an integer of 1 to 3; b is an integer of 0 to 2; and the sum of a and b is 1 to 3.

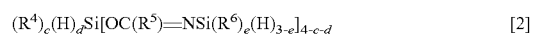  [2]

In the general formula [2], $R^4$ and $R^6$ are each independently a $C_1$-$C_{18}$ monovalent hydrocarbon group in which a part or all of hydrogen atoms may be substituted by a fluorine atom; $R^5$ is each independently a group selected from the group consisting of a $C_1$-$C_6$ alkyl group in which a part or all of hydrogen atoms may be substituted by a fluorine atom, and a hydrogen atom; c is an integer of 1 to 3; d is an integer of 0 to 2; e is an integer of 1 to 3; and the sum of c and d is 1 to 3.

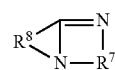  [3]

In the general formula [3], $R^7$ and $R^8$ are each independently a divalent organic group consisting of carbon and/or nitrogen and hydrogen, in which the total number of carbon and nitrogen atoms is 1 to 9; and, in the case where the total number of carbon and nitrogen atoms is 2 or greater, there may exit a carbon atom that does not form a ring.

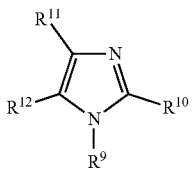

[4]

In the general formula [4], $R^9$ is a $C_1$-$C_6$ alkyl group in which a part of all of hydrogen atoms may be substituted by a fluorine atom, a trialkylsilyl group having a $C_1$-$C_8$ alkyl group in which a part of all of hydrogen atoms may be substituted by a fluorine atom, a $C_2$-$C_6$ alkenyl group in which a part of all of hydrogen atoms may be substituted by a fluorine atom, a $C_1$-$C_6$ alkoxy group in which a part of all of hydrogen atoms may be substituted by a fluorine atom, an amino group, an alkylamino group having a $C_1$-$C_6$ alkyl group in which a part of all of hydrogen atoms may be substituted by a fluorine atom, a dialkylamino group having a $C_1$-$C_6$ alkyl group in which a part of all of hydrogen atoms may be substituted by a fluorine atom, a $C_1$-$C_6$ aminoalkyl group in which a part of all of hydrogen atoms may be substituted by a fluorine atom, a nitro group, a cyano group, a phenyl group, a benzyl group, or a halogen atom; and $R^{10}$, $R^{11}$ and $R^{12}$ are each independently a $C_1$-$C_6$ alkyl group in which a part or all of hydrogen atoms may be substituted by a fluorine atom, or a hydrogen atom.

[5]

In the general formula [5], $R^{13}$ is each independently a $C_1$-$C_{18}$ monovalent hydrocarbon group in which a part or all of hydrogen atoms may be substituted by a fluorine atom; $R^{14}$ is each independently a $C_1$-$C_6$ alkyl group in which a part or all of hydrogen atoms may be substituted by a fluorine atom; f is an integer of 1 to 3; g is an integer of 0 to 2; and the sum of f and g is 1 to 3.

[6]

In the general formula [6], $R^{15}$ is each independently a $C_1$-$C_{18}$ monovalent hydrocarbon group in which a part or all of hydrogen atoms may be substituted by a fluorine atom; X is each independently a halogen atom, an alkylsulfonate group, or a perfluoroalkylsulfonate group; h is an integer of 1 to 3; i is an integer of 0 to 2; and the sum of h and i is 1 to 3.

Preferably, the amount of the component (IV) contained relative to the amount of the component (I) is more than or equal to 0.001 and less than 1 in terms of molar ratio. With the addition of the component (IV), the water repellency of a protective film formed from the surface treatment agent is improved. This effect is more effectively obtained when the amount of the component (IV) contained is in the above-specified range.

To easily obtain a particularly good water repellency imparting effect, it is preferable that the surface treatment agent contains, as the component (IV), at least one kind of silicon compound represented by the general formula [5] in which f is 3; and $R^{14}$ is a $C_1$-$C_6$ fluorine-containing alkyl group. Among others, $(CH_3)_3SiOC(=O)CF_3$ is especially preferred as the component (IV) from the viewpoint of water repellency imparting effect.

To easily obtain a particularly good water repellency imparting effect, it is also preferable that the surface treatment agent contains, as the component (IV), at least one kind of silicon compound represented by the general formula [6] in which h is 3; i is 0; and $R^{15}$ is a $C_1$-$C_6$ alkyl group or a $C_1$-$C_6$ fluorine-containing alkyl group. Further, it is preferable that X in the general formula [6] is a chlorine atom, to easily obtain a particularly good water repellency imparting effect. Among others, $(CH_3)_3SiCl$ is especially preferred as the component (IV).

The concentration of the component (II) is preferably 0.05 to 10 mass % with respect to the total amount of the components (I) to (IV).

Preferably, the component (II) is liquid at 25° C. and 1.0 atmospheric pressure from the viewpoint of solubility.

It is preferable that, in the general formula [4], $R^9$ is a $C_1$-$C_4$ alkyl group or a trimethylsilyl group, and $R^{10}$, $R^{11}$ and $R_{12}$ are each a hydrogen atom.

The component (II) is preferably at least one selected from the group consisting of N-methylimidazole, N-ethylimidazole, N-propylimidazole, N-butylimidazole and trimethylsilylimidazole from the viewpoint of solubility.

The concentration of the component (I) is preferably 0.1 to 35 mass % with respect to the total amount of the components (I) to (IV) for ease of forming the protective film uniformly on the surface of the workpiece. When the concentration of the component (I) is higher than or equal to 0.1 mass %, the water repellency imparting effect tends to be easily obtained. When the concentration of the component (I) is lower than or equal to 35 mass %, the possibility that the component (I) causes corrosion to the surface of the workpiece or remains as an impurity on the surface of the workpiece is low. It is further favorable, from the viewpoint of cost, to use the component (I) at the concentration of 35 mass % or less. The concentration of the component (I) is more preferably 0.5 to 30 mass %, still more preferably 1 to 20 mass %, most preferably 1 to 9 mass %.

To easily obtain a particularly good water repellency imparting effect, it is preferable that the surface treatment agent contains, as the component (I), at least one kind of silicon compound represented by the general formula [1] in which a is 3; $R^2$ is a methyl group; and $R^3$ is a $C_1$-$C_6$ fluorine-containing alkyl group. Among others, $(CH_3)_3SiN(CH_3)C(=O)CF_3$ is especially preferred as the component (I).

To easily obtain a particularly good water repellency imparting effect, it is also preferable that the surface treatment agent contains, as the component (I), at least one kind of silicon compound represented by the general formula [2] in which each of c and e is 3; and $R^5$ is a methyl group or a trifluoromethyl group. Among others, $(CH_3)_3SiOC(CF_3)=NSi(CH_3)_3$ is especially preferred as the component (I).

The organic solvent is preferably an aprotic solvent.

A second aspect of the present disclosure is directed to a method for manufacturing a surface treated body, comprising bringing the above-mentioned surface treatment agent into contact with a surface of a workpiece and thereby surface treating the workpiece.

According to the present disclosure, there is provided the surface treatment agent with no fear that it takes time to dissolve the raw materials for preparation of the surface treatment agent and no fear that the surface treatment agent does not exert a sufficient water repellency imparting effect. There is also provided the method for manufacturing the surface treated body with the use of the surface treatment agent.

DETAILED DESCRIPTION OF THE EMBODIMENTS

1. Surface Treatment Agent

Figure 1:
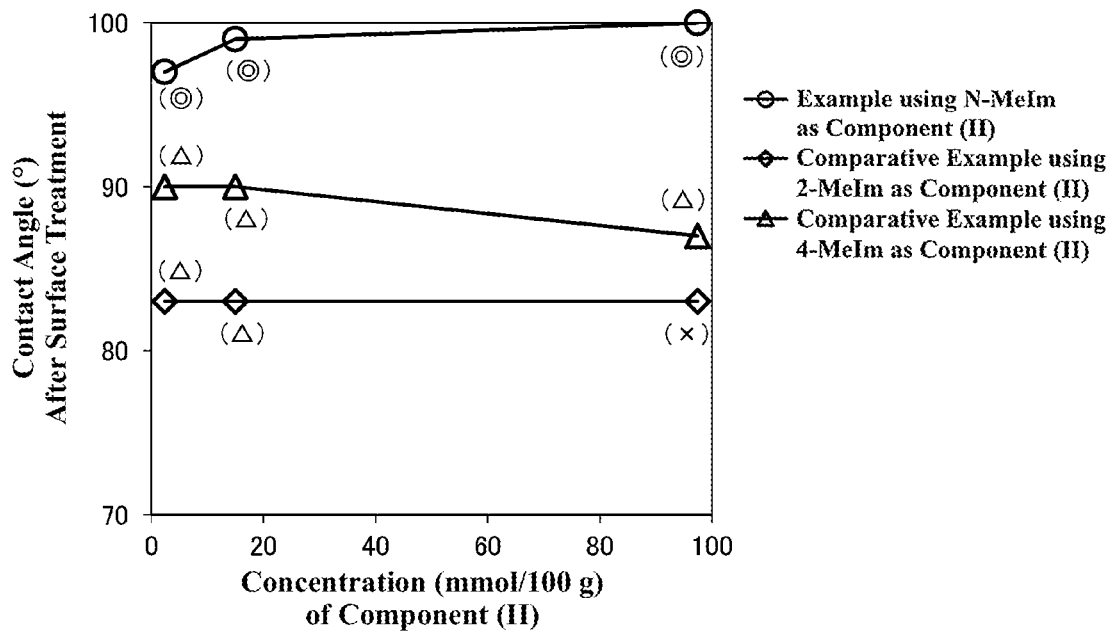
FIG. 1 is a diagram showing a plot of the contact angle after the surface treatment relative to the concentration of the component (II) (in the case of using a PGMEA solvent).

The surface treatment agent according to the present disclosure is used for silylation of surfaces of workpieces, and contains the following components:
- (I) at least one kind selected from the group consisting of silicon compounds represented by the general formulas [1] and [2];
- (II) at least one kind selected from the group consisting of nitrogen-containing heterocyclic compound represented by the general formula [3], nitrogen-containing heterocyclic compound represented by the general formula [4] and imidazole;
- (III) an organic solvent; and
- (IV) at least one kind selected from the group consisting of silicon compounds represented by the general formulas [5] and [6].

There is no particular limitation on the kind of the workpiece. The workpiece is preferably a substrate. As the "substrate" to be subjected to sililation treatment, there can be exemplified a substrate for manufacturing of a semiconductor device. A "surface of the workpiece" refers to a surface of the substrate itself, a surface of an inorganic pattern or resin pattern provided on the substrate, or a surface of an unpatterned inorganic layer or organic layer provided on the substrate.

An example of the inorganic pattern provided on the substrate is a pattern formed by applying an etching mask by a photoresist technique to an inorganic layer on the substrate and etching the inorganic layer through the etching mask. The inorganic layer can be the substrate itself, an oxide film of an element constituting the substrate, or a film or layer of inorganic substance such as silicon nitride, titanium nitride or tungsten formed on the substrate etc. There is no particular limitation on such a film or layer. The film or layer may be any film or layer of inorganic substance formed during the manufacturing process of the semiconductor device.

An example of the resin pattern provided on the substrate is a resin pattern formed by a photoresist technique on the substrate and, more specifically, by e.g. applying an organic layer as a photoresist film to the substrate, exposing the organic layer to light through a photomask and developing the exposed organic layer. The organic layer can be a surface of the substrate itself, or a surface of a laminated film provided on the surface of the substrate etc. There is no particular limitation on the organic layer. The organic layer may be a film of organic substance applied for formation of the etching mask during the manufacturing process of the semiconductor device.

The surface treatment agent is of the solution type where the components (I), (II) and (IV) are dissolved in the organic solvent component (III). The surface treatment can be performed by applying the solution-type surface treatment agent to the surface of the workpiece such as substrate by a spin coating method, an immersion method or the like and thereby bringing the surface treatment agent into contact with the surface of the workpiece. Alternatively, the surface treatment can be performed by vaporizing the solution-type surface treatment agent, supplying the vapor of the surface treatment agent to the surface of the workpiece such as substrate, condensing and retaining the vapor of the surface treatment agent on the substrate and thereby bringing the surface treatment agent into contact with the surface of the workpiece.

Hereinafter, the respective components will be explained below.

Silicon Compound as Component (I)

Each of $R^1$ in the general formula [1] and $R^4$ in the general formula [2] is a water-repellent functional group. A moiety of the silicon compound including such a water-repellent functional group is fixed to the workpiece through reaction of a $-N(R^2)C(=O)R^3$ group in the general formula [1] or $-OC(R^5)=NSi(R^6)_e(H)_{3-e}$ group in the general formula [2] with the surface of the workpiece, whereby a protective film having water repellency (hereinafter also referred to as "water-repellent protective film" or simply referred to as "protective film") is formed on the workpiece. It is preferable that the aforementioned group which reacts with the surface of the workpiece has a structure to more enhance the water repellency of the protective film. The combined use of the silicon compound and the component (II) enables quick reaction of the silicon compound with the surface of the workpieces so as to exert a water repellency imparting effect.

Specific examples of the silicon compound represented by the general formula [1] include: N-methyl-N-alkylsilyltrifluoroacetamides such as $CH_3Si[N(CH_3)C(=O)CF_3]_3$, $C_2H_5Si[N(CH_3)C(=O)CF_3]_3$, $C_3H_7Si[N(CH_3)C(=O)CF_3]_3$, $C_4H_9Si[N(CH_3)C(=O)CF_3]_3$, $C_5H_{11}Si[N(CH_3)C(=O)CF_3]_3$, $C_6H_{13}Si[N(CH_3)C(=O)CF_3]_3$, $C_7H_{15}Si[N(CH_3)C(=O)CF_3]_3$, $C_8H_{17}Si[N(CH_3)C(=O)CF_3]_3$, $C_9H_{19}Si[N(CH_3)C(=O)CF_3]_3$, $C_{10}H_{21}Si[N(CH_3)C(=O)CF_3]_3$, $C_{11}H_{23}Si[N(CH_3)C(=O)CF_3]_3$, $C_{12}H_{25}Si[N(CH_3)C(=O)CF_3]_3$, $C_{13}H_{27}Si[N(CH_3)C(=O)CF_3]_3$, $C_{14}H_{29}Si[N(CH_3)C(=O)CF_3]_3$, $C_{15}H_{31}Si[N(CH_3)C(=O)CF_3]_3$, $C_{16}H_{33}Si[N(CH_3)C(=O)CF_3]_3$, $C_{17}H_{35}Si[N(CH_3)C(=O)CF_3]_3$, $C_{18}H_{37}Si[N(CH_3)C(=O)CF_3]_3$, $(CH_3)_2Si[N(CH_3)C(=O)CF_3]_2$, $C_2H_5Si(CH_3)[N(CH_3)C(=O)CF_3]_2$, $(C_2H_5)_2Si[N(CH_3)C(=O)CF_3]_2$, $C_3H_7Si(CH_3)[N(CH_3)C(=O)CF_3]_2$, $(C_3H_7)_2Si[N(CH_3)C(=O)CF_3]_2$, $C_4H_9Si(CH_3)[N(CH_3)C(=O)CF_3]_2$, $(C_4H_9)_2Si[N(CH_3)C(=O)CF_3]_2$, $C_5H_{11}Si(CH_3)[N(CH_3)C(=O)CF_3]_2$, $C_6H_{13}Si(CH_3)[N(CH_3)C(=O)CF_3]_2$, $C_7H_{15}Si(CH_3)[N(CH_3)C(=O)CF_3]_2$, $C_8H_{17}Si(CH_3)[N(CH_3)C(=O)CF_3]_2$, $C_9H_{19}Si(CH_3)[N(CH_3)C(=O)CF_3]_2$, $C_{10}H_{21}Si(CH_3)[N(CH_3)C(=O)CF_3]_2$, $C_{11}H_{23}Si(CH_3)[N(CH_3)C(=O)CF_3]_2$, $C_{12}H_{25}Si(CH_3)[N(CH_3)C(=O)CF_3]_2$, $C_{13}H_{27}Si(CH_3)[N(CH_3)C(=O)CF_3]_2$, $C_{14}H_{29}Si(CH_3)[N(CH_3)C(=O)CF_3]_2$, $C_{15}H_{31}Si(CH_3)[N(CH_3)C(=O)CF_3]_2$, $C_{16}H_{33}Si(CH_3)[N(CH_3)C(=O)CF_3]_2$, $C_{17}H_{35}Si(CH_3)[N(CH_3)C(=O)CF_3]_2$, $C_{18}H_{37}Si(CH_3)[N(CH_3)C(=O)CF_3]_2$, $(CH_3)_3SiN(CH_3)C(=O)CF_3$, $C_2H_5Si(CH_3)_2N(CH_3)C(=O)CF_3$, $(C_2H_5)_2Si(CH_3)N(CH_3)C(=O)CF_3$, $(C_2H_5)_3SiN(CH_3)C(=O)CF_3$ $C_3H_7Si(CH_3)_2N(CH_3)C(=O)CF_3$, $(C_3H_7)_2Si(CH_3)N(CH_3)C(=O)CF_3$, $(C_3H_7)_3SiN(CH_3)C(=O)CF_3$, $C_4H_9Si(CH_3)_2N(CH_3)C(=O)CF_3$, $(C_4H_9)_3SiN(CH_3)C(=O)CF_3$, $C_5H_{11}Si(CH_3)_2N(CH_3)C(=O)CF_3$, $C_6H_{13}Si(CH_3)_2N(CH_3)C(=O)CF_3$, $C_7H_{15}Si(CH_3)_2N(CH_3)C(=O)CF_3$, $C_8H_{17}Si(CH_3)_2N(CH_3)C(=O)CF_3$, $C_9H_{19}Si(CH_3)_2N(CH_3)C(=O)CF_3$, $C_{10}H_{21}Si(CH_3)_2N(CH_3)C(=O)CF_3$, $C_{11}H_{23}Si(CH_3)_2N(CH_3)C(=O)CF_3$, $C_{12}H_{25}Si(CH_3)_2N(CH_3)C(=O)CF_3$, $C_{13}H_{27}Si(CH_3)_2N(CH_3)C(=O)CF_3$, $C_{14}H_{29}Si(CH_3)_2N(CH_3)C(=O)CF_3$, $C_{15}H_{31}Si(CH_3)_2N(CH_3)C(=O)CF_3$, $C_{16}H_{33}Si(CH_3)_2N(CH_3)C(=O)CF_3$, $C_{17}H_{35}Si(CH_3)_2N(CH_3)C(=O)CF_3$, $C_{18}H_{37}Si(CH_3)_2N(CH_3)C(=O)CF_3$, $(CH_3)_2Si(H)N(CH_3)C(=O)CF_3$, $CH_3Si(H)_2N(CH_3)C(=O)CF_3$, $(C_2H_5)_2Si(H)N(CH_3)C(=O)CF_3$, $C_2H_5Si(H)_2N(CH_3)C(=O)CF_3$, $C_2H_5Si(CH_3)(H)N(CH_3)C(=O)CF_3$, $(C_3H_7)_2Si(H)N(CH_3)C(=O)CF_3$, $C_3H_7Si(H)_2N(CH_3)C(=O)CF_3$, $CF_3CH_2CH_2Si[N(CH_3)C(=O)CF_3]_3$, $C_2F_5CH_2CH_2Si[N(CH_3)C(=O)CF_3]_3$, $C_3F_7CH_2CH_2Si[N(CH_3)C(=O)CF_3]_3$, $C_4F_9CH_2CH_2Si[N(CH_3)C(=O)CF_3]_3$, $C_5F_{11}CH_2CH_2Si[N(CH_3)C(=O)CF_3]_3$, $C_6F_{13}CH_2CH_2Si[N(CH_3)C(=O)CF_3]_3$, $C_7F_{15}CH_2CH_2Si[N(CH_3)C(=O)CF_3]_3$, $C_8F_{17}CH_2CH_2Si[N(CH_3)C(=O)CF_3]_3$, $CF_3CH_2CH_2Si(CH_3)[N(CH_3)C(=O)CF_3]_2$, $C_2F_5CH_2CH_2Si(CH_3)[N(CH_3)C(=O)CF_3]_2$, $C_3F_7CH_2CH_2Si(CH_3)[N(CH_3)C(=O)CF_3]_2$, $C_4F_9CH_2CH_2Si(CH_3)[N(CH_3)C(=O)CF_3]_2$, $C_5F_{11}CH_2CH_2Si(CH_3)[N(CH_3)C(=O)CF_3]_2$, $C_6F_{13}CH_2CH_2Si(CH_3)[N(CH_3)C(=O)CF_3]_2$, $C_7F_{15}CH_2CH_2Si(CH_3)[N(CH_3)C(=O)CF_3]_2$, $C_8F_{17}CH_2CH_2Si(CH_3)[N(CH_3)C(=O)CF_3]_2$, $CF_3CH_2CH_2Si(CH_3)_2N(CH_3)C(=O)CF_3$, $C_2F_5CH_2CH_2Si(CH_3)_2N(CH_3)C(=O)CF_3$, $C_3F_7CH_2CH_2Si(CH_3)_2N(CH_3)C(=O)CF_3$, $C_4F_9CH_2CH_2Si(CH_3)_2N(CH_3)C(=O)CF_3$, $C_5F_{11}CH_2CH_2Si(CH_3)_2N(CH_3)C(=O)CF_3$, $C_6F_{13}CH_2CH_2Si(CH_3)_2N(CH_3)C(=O)CF_3$, $C_7F_{15}CH_2CH_2Si(CH_3)_2N(CH_3)C(=O)CF_3$, $C_8F_{17}CH_2CH_2Si(CH_3)_2N(CH_3)C(=O)CF_3$ and $CF_3CH_2CH_2Si(CH_3)(H)N(CH_3)C(=O)CF_3$; and those obtained by replacing $-N(CH_3)C(=O)CF_3$ groups of the aforementioned N-methyl-N-alkyl silyltrifluoroacetamides by a $-N(CH_3)C(=O)R^3$ group other than $-N(CH_3)C(=O)CF_3$ (where $R^3$ is a $C_1$-$C_6$ alkyl group in which a part or all of hydrogen atoms may be substituted by fluorine). There can also be used any compound obtained by replacing a methyl group of $-N(CH_3)C(=O)R^3$ of the above-mentioned compound by a hydrogen atom, ethyl group, propyl group, butyl group, trifluoromethyl group, pentafluoroethyl group, heptafluoropropyl group or nonafluorobutyl group etc. The silicon compound represented by the general formula [1] may be commercially available. For example, N-methyl-N-trimethylsilyltrifluoroacetamide $((CH_3)_3SiN(CH_3)C(=O)CF_3)$ available from Tokyo Chemical Industry Co., Ltd. is usable.

From the viewpoint of water repellency imparting effect, $R^2$ in the general formula [1] is preferably a $C_1$-$C_4$ alkyl group in which a part or all of hydrogen atoms may be substituted by fluorine, or a hydrogen atom. A $C_1$-$C_4$ alkyl group or a hydrogen atom is more preferred. Particularly preferred is a methyl group.

Further, $R^3$ in the general formula [2] is preferably an alkyl group having all of hydrogen atoms substituted by fluorine from the viewpoint of water repellency imparting effect. The carbon number of the alkyl group is preferably 1 to 4, particularly preferably 1.

It is preferable that the number of the $-N(R^2)C(=O)R^3$ groups as represented by 4-a-b in the general formula [1] is 1 so as to facilitate uniform formation of the protective film.

To readily maintain the water repellency of the protective film during the after-mentioned cleaning step after the formation of the protective film, b in the general formula [1] is preferably 0.

The combination of two methyl groups and one linear alkyl group is preferable as $R^1$ in the general formula [1] so as to facilitate uniform formation of the protective film. More preferred as $R^1$ are three methyl groups.

Specific examples of the silicon compound represented by the general formula [2] include: compounds such as $CH_3Si[OC(CH_3)=NSi(CH_3)_3]_3$, $C_2H_5Si[OC(CH_3)=NSi(CH_3)_3]_3$, $C_3H_7Si[OC(CH_3)=NSi(CH_3)_3]_3$, $C_4H_9Si[OC(CH_3)=NSi(CH_3)_3]_3$, $C_5H_{11}Si[OC(CH_3)=NSi(CH_3)_3]_3$, $C_6H_{13}Si[OC(CH_3)=NSi(CH_3)_3]_3$, $C_7H_{15}Si[OC(CH_3)=NSi(CH_3)_3]_3$, $C_8H_{17}Si[OC(CH_3)=NSi(CH_3)_3]_3$, $C_9H_{19}Si[OC(CH_3)=NSi(CH_3)_3]_3$, $C_{10}H_{21}Si[OC(CH_3)=NSi(CH_3)_3]_3$, $C_{11}H_{23}Si[OC(CH_3)=NSi(CH_3)_3]_3$, $C_{12}H_{25}Si[OC(CH_3)=NSi(CH_3)_3]_3$, $C_{13}H_{27}Si[OC(CH_3)=NSi(CH_3)_3]_3$, $C_{14}H_{29}Si[OC(CH_3)=NSi(CH_3)_3]_3$, $C_{15}H_{31}Si[OC(CH_3)=NSi(CH_3)_3]_3$, $C_{16}H_{33}Si[OC(CH_3)=NSi(CH_3)_3]_3$, $C_{17}H_{35}Si[OC(CH_3)=NSi(CH_3)_3]_3$, $C_{18}H_{37}Si[OC(CH_3)=NSi(CH_3)_3]_3$, $(CH_3)_2Si[OC(CH_3)=NSi(CH_3)_3]_2$, $C_2H_5Si(CH_3)[OC(CH_3)=NSi(CH_3)_3]_2$, $(C_2H_5)_2Si[OC(CH_3)=NSi(CH_3)_3]_2$, $C_3H_7Si(CH_3)[OC(CH_3)=NSi(CH_3)_3]_2$, $(C_3H_7)_2Si[OC(CH_3)=NSi(CH_3)_3]_2$, $C_4H_9Si(CH_3)[OC(CH_3)=NSi(CH_3)_3]_2$, $(C_4H_9)_2Si[OC(CH_3)=NSi(CH_3)_3]_2$, $C_5H_{11}Si(CH_3)[OC(CH_3)=NSi(CH_3)_3]_2$, $C_6H_{13}Si(CH_3)[OC(CH_3)=NSi(CH_3)_3]_2$, $C_7H_{15}Si(CH_3)[OC(CH_3)=NSi(CH_3)_3]_2$, $C_8H_{17}Si(CH_3)[OC(CH_3)=NSi(CH_3)_3]_2$, $C_9H_{19}Si(CH_3)[OC(CH_3)=NSi(CH_3)_3]_2$, $C_{10}H_{21}Si(CH_3)[OC(CH_3)=NSi(CH_3)_3]_2$, $C_{11}H_{23}Si(CH_3)[OC(CH_3)=NSi(CH_3)_3]_2$, $C_{12}H_{25}Si(CH_3)[OC(CH_3)=NSi(CH_3)_3]_2$, $C_{13}H_{27}Si(CH_3)[OC(CH_3)=NSi(CH_3)_3]_2$, $C_{14}H_{29}Si(CH_3)[OC(CH_3)=NSi(CH_3)_3]_2$, $C_{15}H_{31}Si(CH_3)[OC(CH_3)=NSi(CH_3)_3]_2$, $C_{16}H_{33}Si(CH_3)[OC(CH_3)=NSi(CH_3)_3]_2$, $C_{17}H_{35}Si(CH_3)[OC(CH_3)=NSi(CH_3)_3]_2$, $C_{18}H_{37}Si(CH_3)[OC(CH_3)=NSi(CH_3)_3]_2$, $(CH_3)_3SiOC(CH_3)=NSi(CH_3)_3$, $C_2H_5Si(CH_3)_2OC(CH_3)=NSi(CH_3)_3$, $(C_2H_5)_2Si(CH_3)OC(CH_3)=NSi(CH_3)_3$, $(C_2H_5)_3SiOC(CH_3)=NSi(CH_3)_3$, $C_3H_7Si(CH_3)_2OC(CH_3)=NSi(CH_3)_3$, $(C_3H_7)_2Si(CH_3)OC(CH_3)=NSi(CH_3)_3$, $(C_3H_7)_3SiOC(CH_3)=NSi(CH_3)_3$, $C_4H_9Si(CH_3)_2OC(CH_3)=NSi(CH_3)_3$, $(C_4H_9)_3SiOC(CH_3)=NSi(CH_3)_3$, $C_5H_{11}Si(CH_3)_2OC(CH_3)=NSi(CH_3)_3$, $C_6H_{13}Si(CH_3)_2OC(CH_3)=NSi(CH_3)_3$, $C_7H_{15}Si(CH_3)_2OC(CH_3)=NSi(CH_3)_3$, $C_8H_{17}Si(CH_3)_2OC(CH_3)=NSi(CH_3)_3$, $C_9H_{19}Si(CH_3)_2OC(CH_3)=NSi(CH_3)_3$, $C_{10}H_{21}Si(CH_3)_2OC(CH_3)=NSi(CH_3)_{3-e}$ $C_{11}H_{23}Si(CH_3)_2OC(CH_3)=NSi(CH_3)_3$, $C_{12}H_{25}Si(CH_3)_2OC(CH_3)=NSi(CH_3)_3$, $C_{13}H_{27}Si(CH_3)_2OC(CH_3)=NSi(CH_3)_3$, $C_{14}H_{29}Si(CH_3)_2OC(CH_3)=NSi(CH_3)_3$, $C_{15}H_{31}Si(CH_3)_2OC(CH_3)=NSi(CH_3)_3$, $C_{16}H_{33}Si(CH_3)_2OC(CH_3)=NSi(CH_3)_3$, $C_{17}H_{35}Si(CH_3)_2OC(CH_3)=NSi(CH_3)_3$, $C_{18}H_{37}Si(CH_3)_2OC(CH_3)=NSi(CH_3)_3$, $(CH_3)_2Si(H)OC(CH_3)=NSi(CH_3)_3$, $CH_3Si(H)_2OC(CH_3)=NSi(CH_3)_3$, $(C_2H_5)_2Si(H)OC(CH_3)=NSi(CH_3)_3$, $C_2H_5Si(H)_2OC(CH_3)=NSi(CH_3)_3$, $C_2H_5Si(CH_3)(H)OC(CH_3)=NSi(CH_3)_3$, $(C_3H_7)_2Si(H)OC(CH_3)=NSi(CH_3)_3$, $C_3H_7Si(H)_2OC(CH_3)=NSi(CH_3)_3$, $CF_3CH_2CH_2Si[OC(CH_3)=NSi(CH_3)_3]_3$, $C_2F_5CH_2CH_2Si[OC(CH_3)=NSi(CH_3)_3]_3$, $C_3F_7CH_2CH_2Si[OC(CH_3)=NSi(CH_3)_3]_3$, $C_4F_9CH_2CH_2Si[OC(CH_3)=NSi(CH_3)_3]_3$, $C_5F_{11}CH_2CH_2Si[OC(CH_3)=NSi(CH_3)_3]_3$, $C_6F_{13}CH_2CH_2Si[OC(CH_3)=NSi(CH_3)_3]_3$, $C_7F_{15}CH_2CH_2Si[OC(CH_3)=NSi(CH_3)_3]_3$, $C_8F_{17}CH_2CH_2Si[OC(CH_3)=NSi(CH_3)_3]_3$, $CF_3CH_2CH_2Si(CH_3)[OC(CH_3)=NSi(CH_3)_3]_2$, $C_2F_5CH_2CH_2Si(CH_3)[OC(CH_3)=NSi(CH_3)_3]_2$, $C_3F_7CH_2CH_2Si(CH_3)[OC(CH_3)=NSi(CH_3)_3]_2$, $C_4F_9CH_2CH_2Si(CH_3)[OC(CH_3)=NSi(CH_3)_3]_2$, $C_5F_{11}CH_2CH_2Si(CH_3)[OC(CH_3)=NSi(CH_3)_3]_2$, $C_6F_{13}CH_2CH_2Si(CH_3)[OC(CH_3)=NSi(CH_3)_3]_2$, $C_7F_{15}CH_2CH_2Si(CH_3)[OC(CH_3)=NSi(CH_3)_3]_2$, $C_8F_{17}CH_2CH_2Si(CH_3)[OC(CH_3)=NSi(CH_3)_3]_2$, $CF_3CH_2CH_2Si(CH_3)_2OC(CH_3)=NSi(CH_3)_3$, $C_2F_5CH_2CH_2Si(CH_3)_2OC(CH_3)=NSi(CH_3)_3$, $C_3F_7CH_2CH_2Si(CH_3)_2OC(CH_3)=NSi(CH_3)_3$, $C_4F_9CH_2CH_2Si(CH_3)_2OC(CH_3)=NSi(CH_3)_3$, $C_5F_{11}CH_2CH_2Si(CH_3)_2OC(CH_3)=NSi(CH_3)_3$, $C_6F_{13}CH_2CH_2Si(CH_3)_2OC(CH_3)=NSi(CH_3)_3$, $C_7F_{15}CH_2CH_2Si(CH_3)_2OC(CH_3)=NSi(CH_3)_3$, $C_8F_{17}CH_2CH_2Si(CH_3)_2OC(CH_3)=NSi(CH_3)_3$ and $CF_3CH_2CH_2Si(CH_3)(H)OC(CH_3)=NSi(CH_3)_3$; and those obtained by replacing $-OC(CH_3)=NSi(CH_3)_3$ groups of the aforementioned compounds by a $-OC(CH_3)=NSi(R^6)_e(H)_{3-e}$ group other than $-OC(CH_3)=NSi(CH_3)_3$ (where $R^6$ is a $C_1$-$C_{18}$ monovalent hydrocarbon group in which a part or all of hydrogen atoms may be substituted by fluorine). There can also be used any compound obtained by replacing a methyl group of $-OC(CH_3)=NSi(R^6)_e(H)_{3-e}$ of the above-mentioned compound by a hydrogen atom, ethyl group, propyl group, butyl group, trifluoromethyl group, pentafluoroethyl group, heptafluoropropyl group or nonafluorobutyl group etc. The silicon compound represented by the general formula [2] may be commercially available. For example, N,O-bis(trimethylsilyl)trifluoroacetamide $((CH_3)_3SiOC(CF_3)=NSi(CH_3)_3)$ available from Tokyo Chemical Industry Co., Ltd. is usable.

From the viewpoint of water repellency imparting effect, $R^5$ in the general formula [2] is preferably a $C_1$-$C_4$ alkyl group in which a part or all of hydrogen atoms may be substituted by fluorine. A methyl group or a trifluoromethyl group is more preferred. Particularly preferred is a trifluoromethyl group.

Further, three methyl groups are preferred as $R^6$ in the general formula [2] from the viewpoint of water repellency imparting effect It is preferable that the number of the $-OC(R^5)=NSi(R^6)_e(H)_{3-e}$ groups as represented by 4-c-d in the general formula [2] is 1 so as to facilitate uniform formation of the protective film.

To readily maintain the water repellency of the protective film during the after-mentioned cleaning step after the formation of the protective film, d in the general formula [2] is preferably 0.

The combination of two methyl groups and one linear alkyl group is preferable as $R^4$ in the general formula [2] so as to facilitate uniform formation of the protective film. More preferred as $R^4$ are three methyl groups.

It is a preferable embodiment that the surface treatment agent contains at least one kind of siliocon compound represented by the general formula [1] in which a is 3; $R^2$ is a methyl group; and $R^3$ is a $C_1$-$C_6$ fluorine-containing alkyl group as the component (I) and contains trimethylsilyltrifluoroacetate, which is a silicon compound represented by the general formula [5], as the after-mentioned component (IV) so as to obtain a particularly good water repellency imparting effect.

The concentration of the component (I) is preferably 0.1 to 35 mass %, with respect to the total 100 mass % of the components (I) to (IV), so as to facilitate uniform formation of the protective film on the surface of the workpiece. When the concentration of the component (I) is higher than or equal to 0.1 mass %, the water repellency imparting effect tends to be easily obtained. When the concentration of the component (I) is lower than or equal to 35 mass %, the possibility that the component (I) causes corrosion to the surface of the workpiece or remains as an impurity on the surface of the workpiece is low. It is further favorable, from the viewpoint of cost, to use the component (I) at the concentration of 35 mass % or less. The concentration of the component (I) is more preferably 0.5 to 30 mass %, still more preferably 1 to 20 mass %, most preferably 1 to 9 mass %.

Component (II)

Each of the nitrogen-containing heterocyclic compound represented by the general formula [3], the nitrogen-containing heterocyclic compound represented by the general formula [4] and imidazole serves to promote the reaction between the $-N(R^2)C(=O)R^3$ group in the general formula [1] and the surface of the workpiece and between the $-OC(R^5)=NSi(R^6)_e(H)_{3-e}$ group in the general formula [2] and the surface of the workpiece. This component itself may form a part of the protective film.

It is preferable that, in the nitrogen-containing heterocyclic compound represented by the general formula [3], $R^7$ is a divalent hydrocarbon group having a carbon number of 3, and $R^8$ is a divalent organic group consisting of carbon and/or nitrogen and hydrogen, in which the total number of carbon and nitrogen atoms is 3 to 5; and there may exit a carbon atom that does not form a ring. Preferably, the nitrogen-containing heterocyclic compound represented by the general formula [3] is liquid at 25° C. and 1.0 atmospheric pressure from the viewpoint of not easily causing insoluble substance after preparation of the surface treatment agent. Specific examples of the nitrogen-containing heterocyclic compound represented by the general formula [3] include 1,5-diazabicyclo[4.3.0]-5-nonene, 1,8-diazabicyclo[5.4.0]-7-undecene and 7-methyl-1,5,7-triazabicyclo[4.4.0]deca-5-ene.

The nitrogen-containing heterocyclic compound represented by the general formula [3] may be commercially available. From the viewpoint of easy availability, suitably usable are 1,5-diazabicyclo[4.3.0]-5-nonene (available from e.g. Tokyo Chemical Industry Co., Ltd.), 1,8-diazabicyclo[5.4.0]-7-undecene (available from e.g. Tokyo Chemical Industry Co., Ltd.), 7-methyl-1,5,7-triazabicyclo[4.4.0]deca-5-ene (available from e.g. Tokyo Chemical Industry Co., Ltd.) and the like.

It is preferable that, in the nitrogen-containing heterocyclic compound represented by the general formula [4], $R^9$ is a $C_1$-$C_4$ alkyl group or a trimethylsilyl group and $R^{10}$, $R^{11}$ and $R^{12}$ are each a hydrogen atom. Specific examples of the nitrogen-containing heterocyclic compound represented by the general formula [4] include N-methylimidazole, N-ethylimidazole, N-propylimidazole, N-butylimidazole and trimethylsilylimidazole.

Preferably, the nitrogen-containing heterocyclic compound represented by the general formula [4] is liquid at 25° C. and 1.0 atmospheric pressure from the viewpoint of not easily causing insoluble substance after preparation of the surface treatment agent. For example, N-methylimidazole, N-ethylimidazole, N-propylimidazole, N-butylimidazole, trimethylsilylimidazole and the like are preferred.

The nitrogen-containing heterocyclic compound represented by the general formula [4] and the imidazole may be commercially available. From the viewpoint of easy availability, suitably usable are imidazole (available from e.g. Tokyo Chemical Industry Co., Ltd.), N-methylimidazole (available from e.g. Tokyo Chemical Industry Co., Ltd.), N-ethylimidazole (available from e.g. Tokyo Chemical Industry Co., Ltd.), N-propylimidazole (available from e.g. Tokyo Chemical Industry Co., Ltd.), N-butylimidazole (available from e.g. Tokyo Chemical Industry Co., Ltd.), trimethylsilylimidazole (available from e.g. Tokyo Chemical Industry Co., Ltd.) and the like The concentration of the component (II) is preferably 0.05 to 10 mass % with respect to the total 100 mass % of the components (I) to (IV). When the concentration of the component (II) is higher than or equal to 0.05 mass %, the reaction promoting effect (by extension, water repellency imparting effect) tends to be easily obtained. When the concentration of the component (II) is lower than or equal to 10 mass %, the component (II) is favorably less likely to cause corrosion to the surface of the workpiece or remain as an impurity on the surface of the workpiece. Further, the surface treatment agent is favorably less likely to become nonuniform without the component being dissolved in the organic solvent. The concentration of the component (II) is more preferably 0.07 to 5 mass %, still more preferably 0.1 to 2 mass %.

Organic Solvent as Component (III)

In the surface treatment agent, the components (I), (II) and (IV) are dissolved in the organic solvent component (III). Since the organic solvent is contained in the surface treatment agent, it is easy to surface treat the workpiece with the surface treatment agent by a spin coating method, an immersion method or the like There is no particular limitation on the kind of the organic solvent as long as the organic solvent is capable of dissolving therein the components (I), (II) and (IV) and causes less damage to the surface of the workpiece (more specifically, the surface of the substrate (inorganic pattern, resin pattern etc.)). A conventionally known organic solvent is usable.

As the organic solvent, suitably usable are aprotic solvents such as hydrocarbons, esters, ethers, ketones, halogen-containing solvents, sulfoxide-based solvents, sulfone solvents, lactone-based solvents, carbonate-based solvents, polyol derivatives without OH groups, nitrogen-containing solvents without NH groups, silicone solvents and terpene-based solvents, thiols and any mixtures thereof. Among others, hydrocarbons, esters, ethers, halogen-containing solvents, polyol derivatives without OH groups and any mixtures thereof are preferred so as to form the water-repellent protective film on the workpiece in a short time. From the viewpoint of the solubility of the components (I), (II) and (IV), it is preferable that the amount of the nonpolar solvent used in the organic solvent is as small as possible. It is particularly preferable that the nonpolar solvent is not used as the organic solvent.

Examples of the hydrocarbons include n-hexane, n-heptane, n-octane, n-nonane, n-decane, n-undecane, n-dodecane, n-tetradecane, n-hexadecane, n-octadecane, n-eicosane, branched hydrocarbons (such as isododecane, isocetane etc.) corresponding in carbon number to those linear hydrocarbons, cyclohexane, methylcyclohexane, decalin, benzene, toluene, xylene, (ortho-, meta- and para-) diethylbenzene, 1,3,5-trimethylbenzene and naphthalene. Examples of the esters include ethyl acetate, n-propyl acetate, i-propyl acetate, n-butyl acetate, i-butyl acetate, n-pentyl acetate, i-pentyl acetate, n-hexyl acetate, n-heptyl acetate, n-octyl acetate, n-pentyl formate, n-butyl propionate, ethyl butyrate, n-propyl butyrate, i-propyl butyrate, n-butyl butyrate, methyl n-octanoate, methyl decanoate, methyl pyruvate, ethyl pyruvate, n-propyl pyruvate, methyl acetoacetate, ethyl acetoacetate, ethyl 2-oxobutanate, dimethyl adipate, methyl 3-methoxypropionate, ethyl 3-methoxypropionate, methyl 3-ethoxypropionate, ethyl 3-ethoxypropionate and ethyl ethoxyacetate. Examples of the ether include di-n-propyl ether, ethyl n-butyl ether, di-n-butyl ether, ethyl n-amyl ether, di-n-amyl ether, ethyl n-hexyl ether, di-n-hexyl ether, di-n-octyl ether, ethers having branched hydrocarbon groups corresponding in carbon number to those of the aforementioned ethers, such as diisopropyl ether and diisoamyl ether, dimethyl ether, diethyl ether, methyl ethyl ether, methyl cyclopentyl ether, diphenyl ether, tetrahydrofuran, dioxane, methyl perfluoropropyl ether, methyl perfluorobutyl ether, ethyl perfluorobutyl ether, methyl perfluorohexyl ether and ethyl perfluorohexyl ether. Examples of the ketone include acetone, acetylacetone, methyl ethyl ketone, methyl propyl ketone, methyl butyl ketone, 2-heptanone, 3-heptanone, cyclohexanone and isophorone. Examples of the halogen-containing solvent include: perfluorocarbons such as perfluorooctane, perfluorononane, perfluorocyclopentane, perfluorocyclohexane and hexafluorobenzene; hydrofluorocarbons such as 1,1,1,3,3-pentafluorobutane, octafluorocyclopentane, 2,3-dihydrodecafluoropenetane and Zeorora H (available from Zeon Corporation); hydrofluoroethers such as methyl perfluoroisobutyl ether, methyl perfluorobutyl ether, ethyl perfluorobutyl ether, ethyl perfluoroisobutyl ether, Asahiklin AE-3000 (available from AGC Inc.), Novec 7100, Novec 7200, Novec 7300 and Novec 7600 (each available from 3M Company); chlorocarbons such as tetrachloromethane; hydrochlorocarbons such as chloroform; chlorofluorocarbons such as dichlorodifluoromethane; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene and 1,2-dichloro-3,3,3-trifluoropropene; perfluoroethers; and perfluoropolyethers. Examples of the sulfoxide-based solvent include dimethyl sulfoxide. Examples of the sulfone solvent include dimethyl sulfone, diethyl sulfone, bis(2-hydroxyethyl)sulfone and tetramethylene sulfone. Examples of the lactone-based solvent include β-propiolactone, γ-butyrolactone, γ-valerolactone, γ-hexanolactone, γ-heptanolactone, γ-octanolactone, γ-nonalactone, γ-decanolactone, γ-undecanolactone, γ-dodecanolactone, δ-valerolactone, δ-hexanolactone, δ-octanolactone, δ-nonalactone, δ-decanolactone, δ-undecanolactone, δ-dodecanolactone and ε-hexanolactone. Examples of the carbonate-based solvent include dimethyl carbonate, ethyl methyl carbonate, diethylcarbonate and propylene carbonate. Examples of the polyol derivative without OH group include ethylene glycol dimethyl ether, ethylene glycol diethyl ether, ethylene glycol dibutyl ether, ethylene glycol monomethyl ether acetate, ethylene glycol monoethyl ether acetate, ethylene glycol monobutyl ether acetate, ethylene glycol diacetate, diethylene glycol dimethyl ether, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol dimethyl ether, propylene glycol diethyl ether, propylene glycol dibutyl ether, propylene glycol monomethyl ether acetate, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol dimethyl ether, butylene glycol monomethyl ether acetate, butylene glycol diacetate, glycerin triacetate, 3-methoxybutyl acetate, 3-methyl-3-methoxybutyl acetate and 3-methyl-3-methoxybutyl propionate. Examples of the nitrogen-containing solvent without NH group include N,N-dimethylformamide, N,N-dimethylacetamide, N,N-diethylacetamide, N-methyl-2-pyrrolidone, N-ethyl-2-pyrrolidone, N-propyl-2-pyrrolidone, 1,3-dimethyl-2-imidazolidinone, 1,3-diethyl-2-imidazolidinone, 1,3-diisopropyl-2-imidazolidinone, triethylamine and pyridine. Examples of the silicone solvent include hexamethyldisiloxane, octamethyltrisiloxane, decamethyltetrasiloxane and dodecamethylpentasiloxane. Examples of the terpene-based solvent include p-menthane, diphenylmenthane, limonene, terpinene, bornane, norbornane and pinane. Examples of the thiol include 1-hexanethiol, 2-methyl-1-pentanethiol, 3-methyl-1-pentanethiol, 4-methyl-1-pentanethiol, 2,2-dimethyl-1-butanethiol, 3,3-dimethyl-1-butanethiol, 2-ethyl-1-butanethiol, 1-heptanethiol, benzylthiol, 1-octanethiol, 2-ethyl-1-hexanethiol, 1-nonanethiol, 1-decanethiol, 1-undecanethiol, 1-dodecanethiol and 1-tridecanethiol.

The polyol derivative without OH group is preferably used as the organic solvent from the viewpoint of the solubility of the components (I), (II) and (IV). Specific examples of the polyol derivative without OH group are those mentioned above. Among others, propylene glycol monoalkyl ether acetate is preferred. Particularly preferred is propylene glycol monomethyl ether acetate.

Silicon Compounds of General Formulas [5] and [6] as Component (IV)

By treatment with the surface treatment agent containing the above-mentioned components (I) to (III), good water repellency is imparted to the workpiece. The water repellency of the protective film formed on the surface of the workpiece is more enhanced with the addition of the component (IV) to the surface treatment agent. Although the detailed mechanism for this effect is uncertain, it is assumed that the water repellency of the protective film is more enhanced by any reaction or interaction between the component (IV) and the component (I), (II) or the workpiece. For example, it is conceivable that the component (IV) makes a bond with the workpiece or becomes incorporated in the protective film whereby the water-repellent functional group represented by $R^{13}$ in the general formula [5] or $R^{15}$ in the general formula [6] is fixed to the workpiece or the protective film so as to enhance the water repellency of the protective film. It is alternatively conceivable that, as the reaction of the component (I) is promoted due to the presence of the component (IV) in the surface treatment agent, the number of the water-repellent functional groups derived from the components (I) is increased.

Specific examples of the silicon compound represented by the general formula [5] include: trifluoroacetoxysilanes such as $CH_3Si(OC(=O)CF_3)_3$, $C_2H_5Si(OC(=O)CF_3)_3$, $C_3H_7Si(OC(=O)CF_3)_3$, $C_4H_9Si(OC(=O)CF_3)_3$, $C_5H_{11}Si(OC(=O)CF_3)_3$, $C_6H_{13}Si(OC(=O)CF_3)_3$, $C_7H_{15}Si(OC(=O)CF_3)_3$, $C_8H_{17}Si(OC(=O)CF_3)_3$, $C_9H_{19}Si(OC(=O)CF_3)_3$, $C_{10}H_{21}Si(OC(=O)CF_3)_3$, $C_{11}H_{23}Si(OC(=O)CF_3)_3$, $C_{12}H_{25}Si(OC(=O)CF_3)_3$, $C_{13}H_{27}Si(OC(=O)CF_3)_3$, $C_{14}H_{29}Si(OC(=O)CF_3)_3$, $C_{15}H_{31}Si(OC(=O)CF_3)_3$, $C_{16}H_{33}Si(OC(=O)CF_3)_3$, $C_{17}H_{35}Si(OC(=O)CF_3)_3$, $C_{18}H_{37}Si(OC(=O)CF_3)_3$, $(CH_3)_2Si(OC(=O)CF_3)_2$, $C_2H_5Si(CH_3)(OC(=O)CF_3)_2$, $(C_2H_5)_2Si(OC(=O)CF_3)_2$, $C_3H_7Si(CH_3)(OC(=O)CF_3)_2$, $(C_3H_7)_2Si(OC(=O)CF_3)_2$, $C_4H_9Si(CH_3)(OC(=O)CF_3)_2$, $(C_4H_9)_2Si(OC(=O)CF_3)_2$, $C_5H_{11}Si(CH_3)(OC(=O)CF_3)_2$, $C_6H_{13}Si(CH_3)(OC(=O)CF_3)_2$, $C_7H_{15}Si(CH_3)(OC(=O)CF_3)_2$, $C_8H_{17}Si(CH_3)(OC(=O)CF_3)_2$, $C_9H_{19}Si(CH_3)(OC(=O)CF_3)_2$, $C_{10}H_{21}Si(CH_3)(OC(=O)CF_3)_2$, $C_{11}H_{23}Si(CH_3)(OC(=O)CF_3)_2$, $C_{12}H_{25}Si(CH_3)(OC(=O)CF_3)_2$, $C_{13}H_{27}Si(CH_3)(OC(=O)CF_3)_2$, $C_{14}H_{29}Si(CH_3)(OC(=O)CF_3)_2$, $C_{15}H_{31}Si(CH_3)(OC(=O)CF_3)_2$, $C_{16}H_{33}Si(CH_3)(OC(=O)CF_3)_2$, $C_{17}H_{35}Si(CH_3)(OC(=O)CF_3)_2$, $C_{18}H_{37}Si(CH_3)(OC(=O)CF_3)_2$, $(CH_3)_3SiOC(=O)CF_3$, $C_2H_5Si(CH_3)_2OC(=O)CF_3$, $(C_2H_5)_2Si(CH_3)OC(=O)CF_3$, $(C_2H_5)_3SiOC(=O)CF_3$, $C_3H_7Si(CH_3)_2OC(=O)CF_3$, $(C_3H_7)_2Si(CH_3)OC(=O)CF_3$, $(C_3H_7)_3SiOC(=O)CF_3$, $C_4H_9Si(CH_3)_2OC(=O)CF_3$, $(C_4H_9)_3SiOC(=O)CF_3$, $C_5H_{11}Si(CH_3)_2OC(=O)CF_3$, $C_6H_{13}Si(CH_3)_2OC(=O)CF_3$, $C_7H_{15}Si(CH_3)_2OC(=O)CF_3$, $C_8H_{17}Si(CH_3)_2OC(=O)CF_3$, $C_9H_{19}Si(CH_3)_2OC(=O)CF_3$, $C_{10}H_{21}Si(CH_3)_2OC(=O)CF_3$, $C_{11}H_{23}Si(CH_3)_2OC(=O)CF_3$, $C_{12}H_{25}Si(CH_3)_2OC(=O)CF_3$, $C_{13}H_{27}Si(CH_3)_2OC(=O)CF_3$, $C_{14}H_{29}Si(CH_3)_2OC(=O)CF_3$, $C_{15}H_{31}Si(CH_3)_2OC(=O)CF_3$, $C_{16}H_{33}Si(CH_3)_2OC(=O)CF_3$, $C_{17}H_{35}Si(CH_3)_2OC(=O)CF_3$, $C_{18}H_{37}Si(CH_3)_2OC(=O)CF_3$, $(CH_3)_2Si(H)OC(=O)CF_3$, $CH_3Si(H)_2OC(=O)CF_3$, $(C_2H_5)_2Si(H)OC(=O)CF_3$, $C_2H_5Si(H)_2OC(=O)CF_3$, $C_2H_5Si(CH_3)(H)OC(=O)CF_3$, $(C_3H_7)_2Si(H)OC(=O)CF_3$, $C_3H_7Si(H)_2OC(=O)CF_3$, $CF_3CH_2CH_2Si(OC(=O)CF_3)_3$, $C_2F_5CH_2CH_2Si(OC(=O)CF_3)_3$, $C_3F_7CH_2CH_2Si(OC(=O)CF_3)_3$, $C_4F_9CH_2CH_2Si(OC(=O)CF_3)_3$, $C_5F_{11}CH_2CH_2Si(OC(=O)CF_3)_3$, $C_6F_{13}CH_2CH_2Si(OC(=O)CF_3)_3$, $C_7F_{15}CH_2CH_2Si(OC(=O)CF_3)_3$, $C_8F_{17}CH_2CH_2Si(OC(=O)CF_3)_3$, $CF_3CH_2CH_2Si(CH_3)(OC(=O)CF_3)_2$, $C_2F_5CH_2CH_2Si(CH_3)(OC(=O)CF_3)_2$, $C_3F_7CH_2CH_2Si(CH_3)(OC(=O)CF_3)_2$, $C_4F_9CH_2CH_2Si(CH_3)(OC(=O)CF_3)_2$, $C_5F_{11}CH_2CH_2Si(CH_3)(OC(=O)CF_3)_2$, $C_6F_{13}CH_2CH_2Si(CH_3)(OC(=O)CF_3)_2$, $C_7F_{15}CH_2CH_2Si(CH_3)(OC(=O)CF_3)_2$, $C_8F_{17}CH_2CH_2Si(CH_3)(OC(=O)CF_3)_2$, $CF_3CH_2CH_2Si(CH_3)_2OC(=O)CF_3$, $C_2F_5CH_2CH_2Si(CH_3)_2OC(=O)CF_3$, $C_3F_7CH_2CH_2Si(CH_3)_2OC(=O)CF_3$, $C_4F_9CH_2CH_2Si(CH_3)_2OC(=O)CF_3$, $C_5F_{11}CH_2CH_2Si(CH_3)_2OC(=O)CF_3$, $C_6F_{13}CH_2CH_2Si(CH_3)_2OC(=O)CF_3$, $C_7F_{15}CH_2CH_2Si(CH_3)_2OC(=O)CF_3$, $C_8F_{17}CH_2CH_2Si(CH_3)_2OC(=O)CF_3$ and $CF_3CH_2CH_2Si(CH_3)(H)OC(=O)CF_3$; and those obtained by replacing $-OC(=O)CF_3$ groups of the aforementioned trifluoroacetoxysilanes by a $-OC(=O)R^{14}$ group other than $-OC(=O)CF_3$ (where $R^{14}$ is a $C_1$-$C_6$ alkyl group in which a part or all of hydrogen atoms may be substituted by fluorine). The silicon compound represented by the general formula [5] may be commercially available. For example, trimethylsilyltrifluoroacetate $((CH_3)_3Si-OC(=O)CF_3)$ available from Tokyo Chemical Industry Co., Ltd. is usable.

From the viewpoint of water repellency imparting effect, $R^{14}$ in the $-OC(=O)R^{14}$ group is preferably an alkyl group having all of hydrogen atoms substituted by fluorine. The carbon number of the alkyl group is preferably 1 to 4, particularly preferably 1.

It is preferable that the number of the $-OC(=O)R^{14}$ groups as represented by 4-f-g in the general formula [5] is 1 to easily obtain a particularly good water repellency imparting effect.

It is further preferable that g in the general formula [5] is 0 to easily obtain a particularly good water repellency imparting effect.

From the viewpoint of water repellency imparting effect, the combination of two methyl groups and one linear alkyl group is preferable as $R^{13}$ in the general formula [5]. More preferred as $R^{13}$ are three methyl groups.

Specific examples of the compound represented by the general formula [6] include: chlorosilanes such as $CH_3SiCl_3$, $C_2H_5SiCl_3$, $C_3H_7SiCl_3$, $C_4H_9SiCl_3$, $C_5H_{11}SiCl_3$, $C_6H_{13}SiCl_3$, $C_7H_{15}SiCl_3$, $C_8H_{17}SiCl_3$, $C_9H_{19}SiCl_3$, $C_{10}H_{21}SiCl_3$, $C_{11}H_{23}SiCl_3$, $C_{12}H_{25}SiCl_3$, $C_{13}H_{27}SiCl_3$, $C_{14}H_{29}SiCl_3$, $C_{15}H_{31}SiCl_3$, $C_{16}H_{33}SiCl_3$, $C_7H_{35}SiCl_3$, $C_{18}H_{37}SiCl_3$, $(CH_3)_2SiCl_2$, $C_2H_5Si(CH_3)Cl_2$, $(C_2H_5)_2SiCl_2$, $C_3H_7Si(CH_3)Cl_2$, $(C_3H_7)_2SiCl_2$, $C_4H_9Si(CH_3)Cl_2$, $(C_4H_9)_2SiCl_2$, $C_5H_{11}Si(CH_3)Cl_2$, $C_6H_{13}Si(CH_3)Cl_2$, $C_7H_{15}Si(CH_3)Cl_2$, $C_8H_{17}Si(CH_3)Cl_2$, $C_9H_{19}Si(CH_3)Cl_2$, $C_{10}H_{21}Si(CH_3)Cl_2$, $C_{11}H_{23}Si(CH_3)Cl_2$, $C_{12}H_{25}Si(CH_3)Cl_2$, $C_{13}H_{27}Si(CH_3)Cl_2$, $C_{14}H_{29}Si(CH_3)Cl_2$, $C_{15}H_{31}Si(CH_3)Cl_2$, $C_{16}H_{33}Si(CH_3)Cl_2$, $C_{17}H_{35}Si(CH_3)Cl_2$, $C_{18}H_{37}Si(CH_3)Cl_2$, $(CH_3)_3SiCl$, $C_2H_5Si(CH_3)_2Cl$, $(C_2H_5)_2Si(CH_3)Cl$, $(C_2H_5)_3SiCl$, $C_3H_7Si(CH_3)_2Cl$, $(C_3H_7)_2Si(CH_3)Cl$, $(C_3H_7)_3SiCl$, $C_4H_9Si(CH_3)_2Cl$, $(C_4H_9)_2SiCl$, $C_5H_{11}Si(CH_3)_2Cl$, $C_6H_{13}Si(CH_3)_2Cl$, $C_7H_{15}Si(CH_3)_2Cl$, $C_8H_{17}Si(CH_3)_2Cl$, $C_9H_{19}Si(CH_3)_2Cl$, $C_{10}H_{21}Si(CH_3)_2Cl$, $C_{11}H_{23}Si(CH_3)_2Cl$, $C_{12}H_{25}Si(CH_3)_2Cl$, $C_{13}H_{27}Si(CH_3)_2Cl$, $C_{14}H_{29}Si(CH_3)_2Cl$, $C_{15}H_{31}Si(CH_3)_2Cl$, $C_{16}H_{33}Si(CH_3)_2Cl$, $C_{17}H_{35}Si(CH_3)_2Cl$, $C_{18}H_{37}Si(CH_3)_2Cl$, $(CH_3)_2Si(H)Cl$, $CH_3Si(H)_2Cl$, $(C_2H_5)_2Si(H)Cl$, $C_2H_5Si(H)_2Cl$, $C_2H_5Si(CH_3)(H)Cl$, $(C_3H_7)_2Si(H)Cl$, $C_3H_7Si(H)_2Cl$, $CF_3CH_2CH_2SiCl_3$, $C_2F_5CH_2CH_2SiCl_3$, $C_3F_7CH_2CH_2SiCl_3$, $C_4F_9CH_2CH_2SiCl_3$, $C_5F_{11}CH_2CH_2SiCl_3$, $C_6F_{13}CH_2CH_2SiCl_3$, $C_7F_{15}CH_2CH_2SiCl_3$, $C_8F_{17}CH_2CH_2SiCl_3$, $CF_3CH_2CH_2Si(CH_3)Cl_2$, $C_2F_5CH_2CH_2Si(CH_3)Cl_2$, $C_3F_7CH_2CH_2Si(CH_3)Cl_2$, $C_4F_9CH_2CH_2Si(CH_3)Cl_2$, $C_5F_{11}CH_2CH_2Si(CH_3)Cl_2$, $C_6F_{13}CH_2CH_2Si(CH_3)Cl_2$, $C_7F_{15}CH_2CH_2Si(CH_3)Cl_2$, $C_8F_{17}CH_2CH_2Si(CH_3)Cl_2$, $CF_3CH_2CH_2Si(CH_3)_2Cl$, $C_2F_5CH_2CH_2Si(CH_3)_2Cl$, $C_3F_7CH_2CH_2Si(CH_3)_2Cl$, $C_4F_9CH_2CH_2Si(CH_3)_2Cl$, $C_5F_{11}CH_2CH_2Si(CH_3)_2Cl$, $C_6F_{13}CH_2CH_2Si(CH_3)_2Cl$, $C_7F_{15}CH_2CH_2Si(CH_3)_2Cl$, $C_8F_{17}CH_2CH_2Si(CH_3)_2Cl$ and $CF_3CH_2CH_2Si(CH_3)(H)Cl$; and those obtained by replacing —Cl atoms of the aforementioned chlorosilanes by a halogen atom other than chlorine, an alkyl sulfonate group or a perfluoroalkylsulfonate group. The compound represented by the general formula [6] may be commercially available. For example, trimethylchlorosilane (($CH_3)_3SiCl$) available from Tokyo Chemical Industry Co., Ltd. is usable.

From the viewpoint of water repellency imparting effect, $R^{15}$ in the general formula [6] is preferably a $C_1$-$C_4$ alkyl group in which a part or all of hydrogen atoms may be substituted by fluorine. The carbon number of the alkyl group is preferably 1 to 4, particularly preferably 1.

It is further preferable that, in the general formula [6], h is 3, and i is 0 to easily obtain a particularly good water repellency imparting effect Preferably, the amount of the component (IV) contained relative to the amount of the component (I) is more than or equal to 0.001 and less than 1 in terms of molar ratio. When the molar ratio is more than or equal to 0.001, the water repellency imparting effect tends to be easily obtained for the protective film. The water repellency of the protective film is more enhanced with increase in the amount of the component (IV) contained. When the amount of the component (IV) contained is increased to a certain level, it becomes difficult to further enhance the water repellency. Thus, the upper limit of the molar ratio is preferably less than 1 from the viewpoint of cost. It is feasible to use only the silicon compound represented by the general formula [5], use only the silicon compound represented by the general formula [6] or use both of the silicon compounds represented by the general formulas [5] and [6] as the component (IV). The above-mentioned content amount refers to the total amount of the silicon compound or compounds used as the component (IV).

In the case of using only the silicon compound represented by the general formula [5] as the component (IV), the amount of the component (IV) contained may more preferably be more than or equal to 0.005 and less than 1, still more preferably more than or equal to 0.01 and less than or equal to 0.5, in terms of molar ratio. In the case of using only the silicon compound represented by the general formula [6] as the component (IV), the amount of the component (IV) contained may more preferably be more than or equal to 0.001 and less than 1, still more preferably more than or equal to 0.01 and less than or equal to 0.5, in terms of molar ratio.

Other Component

For further improvement in stability, the surface treatment agent according to the present disclosure may contain additives such as a polymerization inhibitor, a chain transfer agent, an antioxidant and the like. The surface treatment agent according to the present disclosure may contain heptamethyldisilazane (hereinafter occasionally referred to as "HPMDS") as the other component.

It is preferable that the total amount of water in the starting raw materials of the surface treatment agent is less than or equal to 2000 mass ppm with respect to the total amount of the raw materials. When the total amount of water in the raw materials is less than or equal to 2000 mass ppm, the effects of the silicon compound as the component (I) and of the component (II) can be easily obtained so that it is easy to form the protective film in a short time. It is particularly preferable that the total amount of water in the raw materials of the surface treatment agent is as small as possible. The total amount of water in the raw materials of the surface treatment agent is more preferably less than or equal to 500 mass ppm, still more preferably less than or equal to 200 mass ppm. Due to the fact that the smaller the amount of water present, the more likely the storage stability of the surface treatment agent is to be improved, it is particularly preferable that the total amount of water is small. The total amount of water is particularly preferably less than or equal to 100 mass ppm, more particularly preferably less than or equal to 50 mass ppm. Although it is preferable that the total amount of water in the raw materials of the surface treatment agent is as small as possible, the total amount of water in the raw materials of the surface treatment agent may be 0.1 mass ppm or more as long as within the above range. Consequently, it is preferable that the silicon compound as the component (I), the component (II), the organic solvent and the component (IV) are low in water content.

It is also preferable that, in a particle measurement made in a liquid phase of the surface treatment agent by a light scattering type in-liquid particle detector, the number of particles of diameter larger than 0.2 μm is 100 or less per 1 mL of the surface treatment agent. When the number of particles of diameter larger than 0.2 μm is 100 or less per 1 mL of the surface treatment agent, the risk of damage to the workpiece by the particles is favorably reduced so as to suppress a deterioration in device yield and a deterioration in reliability. Further, it is favorably possible to omit or reduce the cleaning of the workpiece surface with a solvent or water after the formation of the protective film when the number of particles of diameter larger than 0.2 μm is 100 or less per 1 mL of the surface treatment agent. Although it is preferable that the number of particles of diameter larger than 0.2 μm in the surface treatment agent is as less as possible, the number of particles of diameter larger than 0.2 μm may be 1 or more per 1 mL of the surface treatment agent as long as within the above range. In the present disclosure, the particle measurement in the liquid phase of the surface treatment agent can be made by a commercially available measurement device on the basis of a laser light scattering type in-liquid particle measuring method using a laser as a light source. The particle diameter means a light scattering equivalent diameter with reference to a PSL (polystyrene latex) standard particle.

Herein, the term "particles" include not only particles such as dust, dirt, organic solid matter, inorganic solid matter etc. contained as impurities in the raw materials, but also particles such as dust, dirt, organic solid matter, inorganic solid matter etc. introduced as contaminants during the preparation of the surface treatment agent, and specifically refer to particles finally present without being dissolved in the surface treatment agent.

Furthermore, it is preferable that the amount of respective Na, Mg, K, Ca, Mn, Fe, Cu, Li, Al, Cr, Ni, Zn and Ag elements (as metal impurity elements) in the surface treatment agent is less than or equal to 0.1 mass ppb with respect to the total amount of the surface treatment agent. When the amount of the metal impurity element in the surface treatment agent is less than or equal to 0.1 mass ppb with respect to the total amount of the surface treatment agent, the risk of increase in device junction leakage current is favorably reduced so as to suppress a deterioration in device yield and a deterioration in reliability. Further, it is favorably possible to omit or reduce the cleaning of the workpiece surface (that is, the surface of the protective film) with a solvent or water after the formation of the protective film when the amount of the metal impurity element in the surface treatment agent is less than or equal to 0.1 mass ppb with respect to the total amount of the surface treatment agent. For this reason, it is preferable that the amount of the metal impurity elements in the surface treatment agent is as small as possible. The amount of the metal impurity element in the surface treatment agent may however be 0.001 mass ppb or more as long as within the above range.

2. Manufacturing Method of Surface Treated Body

The manufacturing method of the surface treated body according to the present disclosure includes bringing the above-mentioned surface treatment agent into contact with a surface of a workpiece and thereby surface treating the workpiece.

The surface of the workpiece to be subjected to the surface treatment according to the present disclosure refers to a surface of a substrate itself, a surface of an inorganic pattern or resin pattern provided on the substrate, or a surface of an unpatterned inorganic layer or resin layer provided on the substrate.

In the manufacturing method of the surface treated body according to the present disclosure, the surface treated body is obtained through silylation of the surface of the workpiece. The silylation can be for any purpose. Typical purposes of the silylation are to: (1) impart hydrophobicity to the surface of the workpiece such as substrate and improve the adhesion of the substrate to the resin pattern formed of e.g. photoresist; and (2) prevent the occurrence of pattern collapse in the inorganic pattern or resin pattern on the surface of the substrate.

For the above purpose (1), there can be used without particular limitation any conventionally known method of bringing the surface treatment agent into contact with the surface of the workpiece. For example, it is feasible to vaporize the surface treatment agent and bring the vapor of the surface treatment agent into contact with the surface of the workpiece, or feasible to bring the surface treatment agent into contact with the surface of the workpiece by a spin coating method, an immersion method or the like. In the case where the workpiece is a substrate used for formation of a photoresist film as an organic layer, it is desirable to bring the surface treatment agent into contact with the substrate before the formation of the organic layer.

By such treatment operation, the surface of the workpiece is silylated whereby the hydrophobicity of the surface of the workpiece is increased. In the case where the substrate is used as the workpiece and treated with the surface treatment agent, the surface of the substrate is made hydrophobic so that the adhesion of the substrate to e.g. the photoresist is improved.

For the above purpose (2), it is feasible to bring the surface treatment agent into contact with the surface of the substrate as the workpiece prior to a cleaning process after the formation of the inorganic pattern or resin pattern.

After the formation of the inorganic pattern on the surface of the substrate, it is common to clean the surface of the pattern with a water-based cleaning liquid such as SPM (sulfuric hydrogen/hydrogen peroxide mixture) or APM (ammonia/hydrogen peroxide mixture). After this cleaning operation, the surface of the substrate may be further cleaned by replacing the water-based cleaning liquid retained on the substrate surface with a cleaning liquid different from the water-based cleaning liquid (hereinafter referred to as "cleaning liquid A"). Herein, the cleaning liquid A refers to an organic solvent, a mixture of the organic solvent and the water-based cleaning liquid, or a cleaning liquid in which at least one kind selected from acid, alkali and surfactant is admixed with the organic solvent or the mixture of the organic solvent and the water-based cleaning liquid.

Further, it is common to clean away the development residue or the adhered developer by the use of a cleaning liquid such as water or surfactant rinse after the formation of the resin pattern on the surface of the substrate.

There is no particular limitation on the process for cleaning (surface treatment) of the substrate as long as the process is performed by means of a cleaning machine capable of retaining the surface treatment agent in liquid form or the cleaning liquid on the surface of the substrate. For example, it is feasible to adopt a single-substrate processing method using e.g. a spin cleaner in which substrates are cleaned one by one by rotating the substrate in a nearly horizontal position while supplying a liquid to the vicinity of the rotation center, or a batch processing method using a cleaning machine in which a plurality of substrates are cleaned together by immersion in a liquid within a cleaning chamber. There is also no particular limitation on the form of the surface treatment agent or cleaning liquid supplied to the surface of the substrate as long as the surface treatment agent or cleaning liquid is in a liquid state when retained on the substrate surface. The surface treatment agent or cleaning liquid can be supplied in e.g. liquid form, vapor form or the like.

Examples of the organic solvent suitably usable as the cleaning liquid A include hydrocarbons, esters, ethers, ketones, halogen-containing solvents, sulfoxide-based solvents, lactone-based solvents, carbonate-based solvents, alcohols, polyol derivatives and nitrogen-containing organic solvents.

The surface treatment agent in liquid form is used by replacing the water-based cleaning liquid or the cleaning liquid A with the surface treatment agent. The replaced surface treatment agent may be replaced with a cleaning liquid different from the surface treatment agent (hereinafter referred to as "cleaning liquid B").

After the cleaning of the substrate with the water-based cleaning liquid or the cleaning liquid A, the cleaning liquid is replaced with the surface treatment agent in liquid form. While the surface treatment agent is retained on the substrate, the protective film is formed on the surface of the substrate. In the present disclosure, the protective film is not necessarily continuously formed and is not necessarily uniformly formed. It is however preferable that the protective film is continuously and uniformly formed so as to impart higher water repellency.

The time during which the surface treatment agent is retained on the substrate is preferably 1 to 120 seconds.

As the temperature of the surface treatment agent is increased, it becomes easy to form the protective film in a shorter time. The temperature at which the uniform protective film can be easily formed is higher than or equal to 10° C. and lower than a boiling point of the surface treatment agent. In particular, it is preferable to retain the surface treatment agent at a temperature higher than or equal to 15° C. and lower than or equal to a temperature 10° C. lower than the boiling point of the surface treatment agent. It is further preferable to maintain the temperature of the surface treatment agent at the above-mentioned temperature range even while retaining the surface treatment agent on the substrate. Herein, the boiling point of the surface treatment agent refers to a boiling point of any component present in the largest amount by mass ratio among the components of the surface treatment agent.

After the formation of the protective film, the surface of the substrate may be cleaned by replacing the surface treatment agent remaining in liquid form on the substrate surface with the cleaning liquid B, and then, subjected to drying operation. The cleaning liquid B refers to a water-based cleaning liquid, an organic solvent, a mixture of the organic solvent and the water-based cleaning liquid, a cleaning liquid in which at least one kind selected from acid, alkali and surfactant is admixed with the organic solvent or the mixture of the organic solvent and the water-based cleaning liquid, or a mixture thereof with the surface treatment agent. From the viewpoint of removal of particles and metal impurities, the cleaning liquid B is preferably water, an organic solvent, or a mixture of water and an organic solvent.

Examples of the organic solvent suitably usable as the cleaning liquid B include hydrocarbons, esters, ethers, ketones, halogen-containing solvents, sulfoxide-based solvents, alcohols, polyol derivatives and nitrogen-containing organic solvents.

When the organic solvent is used in the cleaning liquid B, there is a case that the water repellency of the protective film formed from the surface treatment agent on the substrate surface is unlikely to be deteriorated by the cleaning of the substrate surface with the cleaning liquid B.

By the formation of the protective film on the substrate surface, water repellency is imparted to the substrate surface. The protective film is held on the substrate surface even when the liquid is removed from the substrate surface.

It is herein assumed that, in a state where the protective film has been formed on the substrate surface, water is retained on the substrate surface. In this case, the contact angle of the water to the substrate surface is preferably 85 to 130° so as to ensure the adhesion of the substrate to the resin pattern formed of e.g. photoresist and suppress the occurrence of pattern collapse. The contact angle is more preferably 90 to 130°.

The liquid retained on the substrate surface on which the protective film has been formed from the surface treatment agent is removed by drying operation. The liquid retained on the substrate surface may be the surface treatment agent, the cleaning liquid B or a mixed liquid thereof. The mixed liquid is a mixture of the surface treatment agent and the cleaning liquid B or a liquid in which the components of the surface treatment agent are contained at lower concentrations than those in the surface treatment agent. In other words, the mixed liquid may be a liquid generated in the middle of replacing the surface treatment agent with the cleaning liquid B or may be a liquid prepared in advance by mixing the components (I) to (III) with the cleaning liquid B. From the viewpoint of the cleanliness of the substrate surface, the liquid to be removed by drying operation is preferably water, the organic solvent or the mixture thereof After the liquid is once removed from the substrate surface, the cleaning liquid B may be retained on the substrate surface and then removed by drying operation.

In the case of cleaning the substrate with the cleaning liquid B after the formation of the protective film, the cleaning time, that is, the time of retaining the cleaning liquid B on the substrate is preferably 1 to 60 seconds from the viewpoint of removal of particles and impurities from the substrate surface. From the viewpoint of the water repellency maintaining effect of the protective film formed on the substrate surface, the water repellency of the substrate surface tends to be easily maintained even after the cleaning process when the organic solvent is used as the cleaning liquid B.

By the drying operation, the liquid retained on the substrate surface is removed. It is preferable to perform the drying operation by a known drying process such as spin drying, IPA (2-propanol) steam drying, Marangoni drying, heat drying, hot-air drying, air-blow drying or vacuum drying.

The protective film may be removed after the drying operation. For removal of the water-repellent protective film, it is effective to cleave C—C bond and C—F bond in the water-repellent protective film. There is no particular limitation on the bond cleavage technique as long as it is capable of cleaving the above-mentioned bonds. For example, the protective film can be removed by treating the substrate surface with light irradiation, heating, ozone exposure, plasma irradiation, corona discharge etc.

In the case of removing the protective film by light irradiation, it is preferable to irradiate the protective film with an ultraviolet light of wavelengths shorter than 340 nm and 240 nm which respectively correspond to 83 kcal/mol and 116 kcal/mol, i.e., the bond energies of C—C bond and C—F bond in the protective film. As a light source, there can be used a metal halide lamp, a low-pressure mercury lamp, a high-pressure mercury lamp, an excimer lamp, a carbon arc lamp or the like. In the case of using a metal halide lamp as the light source, the irradiation intensity of the ultraviolet light is preferably 100 mW/cm$^2$ or higher, more preferably 200 mW/cm$^2$ or higher, as measured by an illuminometer (such as an irradiation intensity meter UM-10 manufactured by Konica Minolta Sensing, Inc. with a light receptor UM-360 (peak sensitivity wavelength: 365 nm, measurement wavelength range: 310 to 400 nm)). When the irradiation intensity is lower than 100 mW/cm$^2$, it takes a long time to remove the protective film. It is preferable to use the low-pressure mercury lamp because the low-pressure mercury lamp enables irradiation with an ultraviolet light of shorter wavelengths so as to, even though the irradiation intensity is low, remove the protective film in a short time.

In the case of removing the protective film by light irradiation, it is preferable to generate ozone in parallel with decomposing the constituent components of the protective film by irradiation with ultraviolet light and induce oxidation volatilization of the constituent components of the protective film by ozone for shortening of the treatment time. As a light source, there can be used a low-pressure mercury lamp, an excimer lamp or the like. The substrate may be heated while being subjected to light irradiation.

In the case of hating the substrate, the heating temperature of the substrate is preferably 400 to 1000° C., more preferably 500 to 900° C.; and the heating time of the substrate is preferably 10 seconds to 60 minutes, more preferably 30 seconds to 10 minutes. The heating may be performed in combination with ozone exposure, plasma irradiation, corona discharge or the like. The substrate may be subjected to light irradiation while heating.

As the method of removing the protective film by heating, it is feasible to bring the substrate into a heat source or place the substrate in a heated atmosphere such as heat treatment furnace. The placement of the substrate in the heated atmosphere is industrially advantageous in terms of easy operation, short treatment time and high treatment capability due to the fact that, even in the case of treating a plurality of substrates, the energy for removal of the protective film can be easily uniformly applied to the respective substrates by placing the substrates in the heated atmosphere.

In the case of removing the protective film by ozone exposure, it is preferable to supply the surface of the substrate with ozone generated by ultraviolet radiation from a low-pressure mercury lamp etc., low-temperature discharge under high voltage application, or the like. The substrate may be subjected to light irradiation or heating while being exposed to ozone.

The protective film on the surface of the substrate can be efficiently removed by any combination of the light irradiation treatment, the heating treatment, the ozone exposure treatment, the plasma irradiation treatment and the corona discharge treatment.

EXAMPLES

The present disclosure will be described in more detail below by way of the following experimental examples. It should however be understood that these experimental examples are not intended to the present disclosure thereto.

The following experimental examples were each conducted to evaluate the ease of dissolution of raw materials during preparation of a surface treatment agent and the water repellency imparting effect exerted by surface treatment of a workpiece (hereinafter also simply referred to as "wafer") with the surface treatment agent. In the respective Examples and Comparative Examples, water, known as a typical water-based cleaning liquid, was used as a liquid brought into contact with a surface of the wafer for contact angle measurement.

In the case of a wafer having a finely unevenly patterned surface, however, it is not possible to exactly evaluate the angle of contact of water with a protective film itself formed on the unevenly patterned surface of the wafer.

The contact angle of a water drop is generally evaluated by dropping several microliters of water on a surface of a sample (substrate) and measuring an angle between the water drop and the substrate surface according to JIS R 3257 "Testing Method of Wettability of Glass Substrate Surface". In the case of the wafer having the pattern, the contact angle is enormously large. This is due to the Wenzel's effect or Cassie's effect by which the apparent contact angle of the water drop becomes increased under the influence of the surface shape (roughness) of the substrate on the contact angle.

In view of the above facts, each of Examples and Comparative Examples was conducted by providing a wafer with a smooth surface, supplying a surface treatment agent to the smooth surface of the wafer to form a protective film on the wafer surface, and then, making various evaluations on the assumption of the thus-formed protective film as a protective film formed on an unevenly patterned surface of a wafer. A silicon wafer having a smooth surface coated with a $SiO_2$ layer, called a "$SiO_2$-coated wafer", was used as the wafer with the smooth surface in each of Examples and Comparative Examples.

Hereinafter, a description will be given of methods for evaluations, a method for preparing a surface treatment agent, a method for manufacturing a surface treated body with the use of a surface treatment agent, and results of evaluations.

(A) Dissolution Time of Raw Materials During Preparation of Surface Treatment Agent Raw materials for preparation of a surface treatment agent were mixed together under a condition that the liquid temperature was maintained at 25° C. The time of stirring until dissolution of the whole raw materials (i.e. dissolution time) was measured by visual inspection. As a matter of course, it is preferable that the dissolution time is shorter because the shorter the dissolution, the easier it is to dissolve the raw materials.

The dissolution time was judged as being at a satisfactory level when the raw materials were dissolved by stirring within 30 seconds at 25° C. In the following tables, the dissolution time was evaluated as "○" in the case where the raw materials were dissolved by stirring during a time period more than 5 seconds and less than or equal to 30 seconds. In the case where the raw materials were dissolved by stirring within 5 seconds, the dissolution time was evaluated as "⊚" upon judging that the solubility was very high. On the other hand, the dissolution time was evaluated as "Δ" in the case where, even though the raw materials were dissolved by continuation of stirring, it took more than 30 seconds to dissolve the raw materials. The dissolution time was evaluated as "×" in the case where it was impossible to dissolve the raw materials even by stirring for 1 hour or more. The dissolution time was judged as being at an unsatisfactory level in these cases.

(B) Contact Angle relative to Protective Film on Wafer Surface

About 2 µl of pure water was dropped on a surface of a wafer on which a protective film was formed. Then, the angle between the water drop and the wafer surface (as a contact angle) was measured with a contact angle meter (manufactured by Kyowa Interface Science Co., Ltd.: CA-X Model). The contact angle was judged as being at a satisfactory level when it was 85° or larger.

Example 1

(1) Preparation of Surface Treatment Agent

Raw materials of a surface treatment agent, that is, N-methyl-N-trimethylsilyltrifluoroacetamide (($CH_3$)$_3$SiN($CH_3$)C(=O)$CF_3$; available from Tokyo Chemical Industry Co., Ltd.; hereinafter also referred to as "MSTFA") as the component (I), imidazole (available from Tokyo Chemical Industry Co., Ltd.; hereinafter also referred to as "Im") as the component (II) propylene glycol monomethyl ether acetate (available from Tokyo Chemical Industry Co., Ltd.; hereinafter also referred to as "PGMEA") as the organic solvent component (III) and trimethylchlorosilane (available from Tokyo Chemical Industry Co., Ltd.; hereinafter also referred to as "TMS-Cl") were mixed at concentrations shown in TABLE 1 while the liquid temperature was maintained at 25° C. The whole raw materials were dissolved by stirring for about 15 seconds. There was thus obtained the surface treatment agent in solution form.

(2) Cleaning of Silicon Wafer

A silicon wafer with a smooth thermal oxide film (more specifically, a silicon wafer having on a surface thereof a thermal oxide film of 1 μm thickness), regarded as a workpiece after the formation of a pattern by an etching process, was immersed in an aqueous solution of 1 mass % hydrogen fluoride at room temperature for 10 minutes, immersed in pure water at room temperature for 1 minute and then immersed in 2-propanol (iPA) at room temperature for 1 minute.

(3) Surface Treatment of Silicon Wafer With Surface Treatment Agent

After the above cleaning operation, the silicon wafer was immersed in the surface treatment agent prepared in the above section "(1) Preparation of Surface Treatment Agent" at room temperature for 20 seconds. The silicon wafer was then immersed in iPA at room temperature for 1 minute. Finally, the silicon wafer was taken out from the iPA and dried by air blowing to remove the iPA from the surface of the silicon wafer.

The evaluation test was carried out according to the procedure mentioned in the above section (B). As shown in TABLE 1, the contact angle after the surface treatment was 93°. Accordingly, the surface treatment agent had a good water repellency imparting effect.

Examples 2 to 62, Reference Examples 1 to 10 and Comparative Examples 1 to 94

The surface treatment of wafers with surface treatment agents was performed in the same manner as in Example 1 except that the kinds and mass % concentrations of the raw material components (I) to (IV) and the other component of the surface treatment agent were changed as shown in TABLES 1 to 5. The surface treated wafers were evaluated in the same manner as above.

In the respective tables, the term "N-MeIm" refers to N-methylimidazole (available from Tokyo Chemical Industry Co., Ltd.); the term "N-EtIm" refers to N-ethylimidazole (available from Tokyo Chemical Industry Co., Ltd.); the term "N-BuIm" refers to N-butylimidazole (available from Tokyo Chemical Industry Co., Ltd.); the term "TMS-Im" refers to N-trimethylsilylimidazole (available from Tokyo Chemical Industry Co., Ltd.); the term "Tet" refers to 1H-tetrazole (available from Tokyo Chemical Industry Co., Ltd.); the term "5-MeTet" refers to 5-methyltetrazole (available from Tokyo Chemical Industry Co., Ltd.); the term "Tri" refers to 1,2,4-triazole (available from Tokyo Chemical Industry Co., Ltd.); the term "BzoTri" refers to 1,2,3-benzotriazole (available from Tokyo Chemical Industry Co., Ltd.); the term "Pyr" refers to pyrazole (available from Tokyo Chemical Industry Co., Ltd.); the term "2-MeIm" refers to 2-methylimidazole (available from Tokyo Chemical Industry Co., Ltd.); the term "4-MeIm" refers to 4-methylimidazole (available from Tokyo Chemical Industry Co., Ltd.); the term "TFAcIm" refers to 1-(trifluoroacetyl)imidazole (available from Tokyo Chemical Industry Co., Ltd.); the term "3-Mer-1,2,4-Tri" refers to 3-mercapto-1,2,4-triazole (available from Tokyo Chemical Industry Co., Ltd.); the term "5-MeBzoTri" refers to 5-methyl-1H-benzotriazole (available from Tokyo Chemical Industry Co., Ltd.); the term "5-AminoTet" refers to 5-amino-1H-tetrazole (available from Tokyo Chemical Industry Co., Ltd.); the term "Tet-1-AcOH" refers to 1H-tetrazole-1-acetic acid (available from Tokyo Chemical Industry Co., Ltd.); the term "Tet-5-AcOH" refers to 1H-tetrazole-5-acetic acid (available from Tokyo Chemical Industry Co., Ltd.); the term "5-Mer-1-MeTet" refers to 5-mercapto-1-methyltetrazole (available from Tokyo Chemical Industry Co., Ltd.); the term "5-BnTet" refers to 5-benzyl-1H-tetrazole (available from Tokyo Chemical Industry Co., Ltd.); the term "5-PhTet" refers to 5-phenyltetrazole (available from Tokyo Chemical Industry Co., Ltd.); the term "5-pTolTet" refers to 5-(p-tolyl)-1H-tetrazole (available from Tokyo Chemical Industry Co., Ltd.); the term "5-Mer-1-PhTet" refers to 5-mercapto-1-phenyl-1H-tetrazole (available from Tokyo Chemical Industry Co., Ltd.); the term "5-MeThiTet" refers to 5-(methylthio)-1H-tetrazole (available from Sigma-Aldrich Co. LLC.); the term "Sac" refers to o-sulfonebenzimide (saccharin; available from Tokyo Chemical Industry Co., Ltd.); the term "iOx" refers to isoxazole (available from Tokyo Chemical Industry Co., Ltd.); the term "TMS-DMA" refers to N-(trimethylsilyl)dimethylamine (available from Tokyo Chemical Industry Co., Ltd.); the term "HMDS" refers to 1,1,1,3,3,3-hexamethyldisilazane (available from Tokyo Chemical Industry Co., Ltd.); the term "TDACP" refers to 2,2,5,5-tetramethyl-2,5-disila-1-azacyclopentane (available from Gelest Co., Ltd.); the term "HMCTS" refers to 2,2,4,4,6,6-hexamethylcyclotrisilazane (available from Tokyo Chemical Industry Co., Ltd.); the term "TMS-TFA" refers to trimethylsilyltrifluoroacetate (($CH_3$)$_3$Si—OC(=O)$CF_3$); available from Tokyo Chemical Industry Co., Ltd.); the term "BSTFA" refers to N,O-bis(trimethylsilyl)trifluoroacetamide (($CH_3$)$_3$SiOC($CF_3$)=NSi($CH_3$)$_3$; available from Tokyo Chemical Industry Co., Ltd.); the term "THF" refers to tetrahydrofuran (available from Fujifilm Wako Pure Chemical Corporation); and the term "HPMDS" refers to heptamethyldisilazane (available from Tokyo Chemical Industry Co., Ltd.).

Further, the term "PGMEA/THF-0.01" refers to a mixed solvent of PGMEA (available from Tokyo Chemical Industry Co., Ltd.) and THF (available from Fujifilm Wako Pure Chemical Corporation) in which the concentration of THF was 0.01 mass % with respect to the total amount of the components (I) to (IV).

TABLE 1

| | Composition of Surface Treatment Agent | | | | | | | |
|---|---|---|---|---|---|---|---|---|
| | (I) | | | (II) | | | | |
| | | Kind | Conc. of (I) with respect to Total Amount of (I) to (IV) [mass %] | [mmol/100 g] | Kind | Form at 25° C. 1 atm | Conc. of (II) with respect to Total Amount of (I) to (IV) [mass %] | [mmol/100 g] | (III) Organic Solvent |
| Ex. 1 | | MSTFA | 6.0 | 30.2 | Im | solid | 0.2 | 2.4 | PGMEA |
| Ex. 2 | | MSTFA | 6.0 | 30.2 | N-MeIm | liquid | 0.2 | 2.4 | PGMEA |
| Ex. 3 | | MSTFA | 6.0 | 30.2 | N-EtIm | liquid | 0.2 | 2.4 | PGMEA |
| Ex. 4 | | MSTFA | 6.0 | 30.2 | N-BuIm | liquid | 0.3 | 2.4 | PGMEA |
| Ex. 5 | | MSTFA | 6.0 | 30.2 | TMS-Im | liquid | 0.3 | 2.4 | PGMEA |
| Ex. 6 | | MSTFA | 6.0 | 30.2 | TMS-Im | liquid | 0.3 | 2.4 | PGMEA |
| Ref. Ex. 1 | | MSTFA | 6.0 | 30.2 | Im | solid | 0.2 | 2.4 | PGMEA |
| Ref. Ex. 2 | | MSTFA | 6.0 | 30.2 | N-MeIm | liquid | 0.2 | 2.4 | PGMEA |
| Ref. Ex. 3 | | MSTFA | 6.0 | 30.2 | N-EtIm | liquid | 0.2 | 2.4 | PGMEA |
| Ref. Ex. 4 | | MSTFA | 6.0 | 30.2 | N-BuIm | liquid | 0.3 | 2.4 | PGMEA |
| Ref. Ex. 5 | | MSTFA | 6.0 | 30.2 | TMS-Im | liquid | 0.3 | 2.4 | PGMEA |

| | Composition of Surface Treatment Agent | | | | | Evaluation Results | |
|---|---|---|---|---|---|---|---|
| | (IV) | | | | Other Component | | |
| | Kind | Conc. of (IV) with respect to Total Amount of (I) to (IV) [mass %] | [mmol/100 g] | (IV)/(I) Molar Ratio | Kind | Amount [mass %] in Surface Treatment Agent | (A) Dissolution Time | (B) Contact Angle [°] |
| Ex. 1 | TMS-Cl | 0.01 | 0.09 | 0.003 | none | — | ○ | 93 |
| Ex. 2 | | | | | | | ◉ | 97 |
| Ex. 3 | | | | | | | ◉ | 96 |
| Ex. 4 | | | | | | | ◉ | 95 |
| Ex. 5 | | | | | | | ◉ | 94 |
| Ex. 6 | TMS-TFA | 0.01 | 0.05 | 0.002 | | | ◉ | 88 |
| Ref. Ex. 1 | none | — | — | — | | | ○ | 86 |
| Ref. Ex. 2 | | | | | | | ◉ | 94 |
| Ref. Ex. 3 | | | | | | | ◉ | 94 |
| Ref. Ex. 4 | | | | | | | ◉ | 93 |
| Ref. Ex. 5 | | | | | | | ◉ | 85 |

TABLE 2

| | Composition of Surface Treatment Agent | | | | | | | | |
|---|---|---|---|---|---|---|---|---|---|
| | (I) | | | (II) | | | | (III) | (IV) |
| | Kind | Conc. of (I) with respect to Total Amount of (I) to (IV) [mass %] | [mmol/100 g] | Kind | Form at 25° C. 1 atm | Conc. of (II) with respect to Total Amount of (I) to (IV) [mass %] | [mmol/100 g] | Organic Solvent | Kind |
| Comp. Ex. 1 | MSTFA | 6.0 | 30.2 | Tet | solid | 0.2 | 2.4 | PGMEA | TMS-Cl |
| Comp. Ex. 2 | MSTFA | 6.0 | 30.2 | 5-MeTet | solid | 0.2 | 2.4 | PGMEA | |
| Comp. Ex. 3 | MSTFA | 6.0 | 30.2 | Tri | solid | 0.2 | 2.4 | PGMEA | |
| Comp. Ex. 4 | MSTFA | 6.0 | 30.2 | BzoTri | solid | 0.3 | 2.4 | PGMEA | |
| Comp. Ex. 5 | MSTFA | 6.0 | 30.2 | Pyr | solid | 0.2 | 2.4 | PGMEA | |
| Comp. Ex. 6 | MSTFA | 6.0 | 30.2 | 2-MeIm | solid | 0.2 | 2.4 | PGMEA | |
| Comp. Ex. 7 | MSTFA | 6.0 | 30.2 | 4-MeIm | solid | 0.2 | 2.4 | PGMEA | |
| Comp. Ex. 8 | MSTFA | 6.0 | 30.2 | TFAcIm | liquid | 0.4 | 2.4 | PGMEA | |
| Comp. Ex. 9 | MSTFA | 6.0 | 30.2 | 3-Mer-1,2,4-Tri | solid | 0.3 | 2.4 | PGMEA | |
| Comp. Ex. 10 | MSTFA | 6.0 | 30.2 | 5-MeBzoTri | solid | 0.3 | 2.4 | PGMEA | |
| Comp. Ex. 11 | MSTFA | 6.0 | 30.2 | 5-AminoTet | solid | 0.2 | 2.4 | PGMEA | |
| Comp. Ex. 12 | MSTFA | 6.0 | 30.2 | Tet-1-AcOH | solid | 0.3 | 2.4 | PGMEA | |
| Comp. Ex. 13 | MSTFA | 6.0 | 30.2 | Tet-5-AcOH | solid | 0.3 | 2.4 | PGMEA | |
| Comp. Ex. 14 | MSTFA | 6.0 | 30.2 | 5-Mer-1-MeTet | solid | 0.3 | 2.4 | PGMEA | |
| Comp. Ex. 15 | MSTFA | 6.0 | 30.2 | 5-BnTet | solid | 0.4 | 2.4 | PGMEA | |
| Comp. Ex. 16 | MSTFA | 6.0 | 30.2 | 5-PhTet | solid | 0.4 | 2.4 | PGMEA | |
| Comp. Ex. 17 | MSTFA | 6.0 | 30.2 | 5-pTolTet | solid | 0.4 | 2.4 | PGMEA | |

TABLE 2-continued

| | | | | | | | | | | |
|---|---|---|---|---|---|---|---|---|---|---|
| Comp. Ex. 18 | MSTFA | 6.0 | 30.2 | 5-Mer-1-PhTet | solid | 0.4 | 2.4 | PGMEA | | |
| Comp. Ex. 19 | MSTFA | 6.0 | 30.2 | 5-MeThiTet | solid | 0.3 | 2.4 | PGMEA | | |
| Comp. Ex. 20 | MSTFA | 6.0 | 30.2 | Sac | solid | 0.5 | 2.4 | PGMEA | | |
| Comp. Ex. 21 | MSTFA | 6.0 | 30.2 | iOx | liquid | 0.2 | 2.4 | PGMEA | | |
| Comp. Ex. 22 | MSTFA | 6.0 | 30.2 | Tet | solid | 0.2 | 2.4 | PGMEA | TMS-TFA |
| Comp. Ex. 23 | MSTFA | 6.0 | 30.2 | 5-MeTet | solid | 0.2 | 2.4 | PGMEA | | |
| Comp. Ex. 24 | MSTFA | 6.0 | 30,2 | Tri | solid | 0.2 | 2.4 | PGMEA | | |
| Comp. Ex. 25 | MSTFA | 6.0 | 30.2 | BzoTri | solid | 0.3 | 2.4 | PGMEA | | |
| Comp. Ex. 26 | MSTFA | 6.0 | 30.2 | Pyr | solid | 0.2 | 2.4 | PGMEA | | |
| Comp. Ex. 27 | MSTFA | 6.0 | 30.2 | 2-MeIm | solid | 0.2 | 2.4 | PGMEA | | |
| Comp. Ex. 28 | MSTFA | 6.0 | 30.2 | 4-MeIm | solid | 0.2 | 2.4 | PGMEA | | |
| Comp. Ex. 29 | MSTFA | 6.0 | 30.2 | TFAcIm | liquid | 0.4 | 2.4 | PGMEA | | |
| Comp. Ex. 30 | MSTFA | 6.0 | 30.2 | 3-Mer-1,2,4-Tri | solid | 0.3 | 2.4 | PGMEA | | |
| Comp. Ex. 31 | MSTFA | 6.0 | 30.2 | 5-MeBzoTri | solid | 0.3 | 2.4 | PGMEA | | |
| Comp. Ex. 32 | MSTFA | 6.0 | 30.2 | 5-AminoTet | solid | 0.2 | 2.4 | PGMEA | | |
| Comp. Ex. 33 | MSTFA | 6.0 | 30,2 | Tet-1-AcOH | solid | 0.3 | 2.4 | PGMEA | | |
| Comp. Ex. 34 | MSTFA | 6.0 | 30.2 | Tet-5-AcOH | solid | 0.3 | 2.4 | PGMEA | | |
| Comp. Ex. 35 | MSTFA | 6.0 | 30.2 | 5-Mer-1-MeTet | solid | 0.3 | 2.4 | PGMEA | | |
| Comp. Ex. 36 | MSTFA | 6.0 | 30.2 | 5-BnTet | solid | 0.4 | 2.4 | PGMEA | | |
| Comp. Ex. 37 | MSTFA | 6.0 | 30.2 | 5-PhTet | solid | 0.4 | 2.4 | PGMEA | | |
| Comp. Ex. 38 | MSTFA | 6.0 | 30.2 | 5-pTolTet | solid | 0.4 | 2.4 | PGMEA | | |
| Comp. Ex. 39 | MSTFA | 6.0 | 30.2 | 5-Mer-1-PhTet | solid | 0.4 | 2.4 | PGMEA | | |
| Comp. Ex. 40 | MSTFA | 6.0 | 30.2 | 5-MeThiTet | solid | 0.3 | 2.4 | PGMEA | | |
| Comp. Ex. 41 | MSTFA | 6.0 | 30.2 | Sac | solid | 0.5 | 2.4 | PGMEA | | |
| Comp. Ex. 42 | MSTFA | 6.0 | 30.2 | iOx | liquid | 0.2 | 2.4 | PGMEA | | |

| | Composition of Surface Treatment Agent | | | | Evaluation Results | |
|---|---|---|---|---|---|---|
| | (IV) | | | Other Component | | |
| | Conc. of (IV) with respect to Total Amount of (I) to (IV) [mass %] | [mmol/100 g] | (IV)/(I) Molar Ratio | Kind | Amount [mass %] in Surface Treatment Agent | (A) Dissolution Time | (B) Contact Angle [°] |
| Comp. Ex. 1 | 0.01 | 0.09 | 0.003 | none | — | Δ | 74 |
| Comp. Ex. 2 | | | | | | Δ | 64 |
| Comp. Ex. 3 | | | | | | X | 44 |
| Comp. Ex. 4 | | | | | | Δ | 52 |
| Comp. Ex. 5 | | | | | | ○ | 49 |
| Comp. Ex. 6 | | | | | | Δ | 83 |
| Comp. Ex. 7 | | | | | | Δ | 90 |
| Comp. Ex. 8 | | | | | | ◎ | 83 |
| Comp. Ex. 9 | | | | | | Δ | 15 |
| Comp. Ex. 10 | | | | | | Δ | 35 |
| Comp. Ex. 11 | | | | | | X | 69 |
| Comp. Ex. 12 | | | | | | Δ | 24 |
| Comp. Ex. 13 | | | | | | Δ | 29 |
| Comp. Ex. 14 | | | | | | Δ | 47 |
| Comp. Ex. 15 | | | | | | Δ | 69 |
| Comp. Ex. 16 | | | | | | Δ | 81 |
| Comp. Ex. 17 | | | | | | X | 79 |
| Comp. Ex. 18 | | | | | | Δ | 56 |
| Comp. Ex. 19 | | | | | | Δ | 75 |
| Comp. Ex. 20 | | | | | | Δ | 51 |
| Comp. Ex. 21 | | | | | | ◎ | 55 |
| Comp. Ex. 22 | 0.01 | 0.05 | 0.002 | none | — | Δ | 73 |
| Comp. Ex. 23 | | | | | | Δ | 63 |
| Comp. Ex. 24 | | | | | | X | 44 |
| Comp. Ex. 25 | | | | | | Δ | 51 |
| Comp. Ex. 26 | | | | | | ○ | 48 |
| Comp. Ex. 27 | | | | | | Δ | 83 |
| Comp. Ex. 28 | | | | | | Δ | 90 |
| Comp. Ex. 29 | | | | | | ◎ | 82 |
| Comp. Ex. 30 | | | | | | Δ | 13 |
| Comp. Ex. 31 | | | | | | Δ | 34 |
| Comp. Ex. 32 | | | | | | X | 68 |
| Comp. Ex. 33 | | | | | | Δ | 23 |
| Comp. Ex. 34 | | | | | | Δ | 28 |
| Comp. Ex. 35 | | | | | | Δ | 46 |
| Comp. Ex. 36 | | | | | | Δ | 68 |
| Comp. Ex. 37 | | | | | | Δ | 80 |
| Comp. Ex. 38 | | | | | | X | 78 |
| Comp. Ex. 39 | | | | | | Δ | 55 |
| Comp. Ex. 40 | | | | | | Δ | 74 |

TABLE 2-continued

| | | | |
|---|---|---|---|
| Comp. Ex. 41 | | Δ | 20 |
| Comp. Ex. 42 | | ◉ | 54 |

TABLE 3

| | Composition of Surface Treatment Agent | | | | | | |
|---|---|---|---|---|---|---|---|
| | (I) | | | (II) | | | |
| | Kind | Conc. of (I) with respect to Total Amount of (I) to (IV) [mass %] | [mmol/100 g] | Kind | Form at 25° C. 1 atm | Conc. of (II) with respect to Total Amount of (I) to (IV) [mass %] | [mmol/100 g] | (III) Organic Solvent |
|---|---|---|---|---|---|---|---|---|
| Comp. Ex. 43 | TMS-DMA | 3.5 | 30.2 | Im | solid | 0.2 | 2.4 | PGMEA |
| Comp. Ex. 44 | HMDS | 4.8 | 30.2 | Im | solid | 0.2 | 2.4 | PGMEA |
| Comp. Ex. 45 | TMS-Im | 4.2 | 30.2 | Im | solid | 0.2 | 2.4 | PGMEA |
| Comp. Ex. 46 | TDACP | 4.8 | 30.2 | Im | solid | 0.2 | 2.4 | PGMEA |
| Comp. Ex. 47 | HMCTS | 6.6 | 30.2 | Im | solid | 0.2 | 2.4 | PGMEA |
| Comp. Ex. 48 | HMDS | 4.8 | 30.2 | Tet | solid | 0.2 | 2.4 | PGMEA |
| Comp. Ex. 49 | HMDS | 4.8 | 30.2 | 5-MeTet | solid | 0.2 | 2.4 | PGMEA |
| Comp. Ex. 50 | HMDS | 4.8 | 30.2 | Tri | solid | 0.2 | 2.4 | PGMEA |
| Comp. Ex. 51 | HMDS | 4.8 | 30.2 | BzoTri | solid | 0.3 | 2.4 | PGMEA |
| Comp. Ex. 52 | HMDS | 4.8 | 30.2 | Pyr | solid | 0.2 | 2.4 | PGMEA |
| Comp. Ex. 53 | HMDS | 4.8 | 30.2 | 2-MeIm | solid | 0.2 | 2.4 | PGMEA |
| Comp. Ex. 54 | HMDS | 4.8 | 30.2 | 4-MeIm | solid | 0.2 | 2.4 | PGMEA |
| Comp. Ex. 55 | HMDS | 4.8 | 30.2 | TFAcIm | liquid | 0.4 | 2.4 | PGMEA |
| Comp. Ex. 56 | HMDS | 4.8 | 30.2 | 3-Mer-1,2,4-Tri | solid | 0.3 | 2.4 | PGMEA |
| Comp. Ex. 57 | HMDS | 4.8 | 30.2 | 5-MeBzoTri | solid | 0.3 | 2.4 | PGMEA |
| Comp. Ex. 5S | HMDS | 4.8 | 30.2 | 5-AminoTet | solid | 0.2 | 2.4 | PGMEA |
| Comp. Ex. 59 | HMDS | 4.8 | 30.2 | Tet-1-AcOH | solid | 0.3 | 2.4 | PGMEA |
| Comp. Ex. 60 | HMDS | 4.8 | 30.2 | Tet-5-AcOH | solid | 0.3 | 2.4 | PGMEA |
| Comp. Ex. 61 | HMDS | 4.8 | 30.2 | 5-Mer-1-MeTet | solid | 0.3 | 2.4 | PGMEA |
| Comp. Ex. 62 | HMDS | 4.8 | 30.2 | 5-BnTet | solid | 0.4 | 2.4 | PGMEA |
| Comp. Ex. 63 | HMDS | 4.8 | 30.2 | 5-PhTet | solid | 0.4 | 2.4 | PGMEA |
| Comp. Ex. 64 | HMDS | 4.8 | 30.2 | 5-pTolTet | solid | 0.4 | 2.4 | PGMEA |
| Comp. Ex. 65 | HMDS | 4.8 | 30.2 | 5-Mer-1-PhTet | solid | 0.4 | 2.4 | PGMEA |
| Comp. Ex. 66 | HMDS | 4.8 | 30.2 | 5-MeThiTet | solid | 0.3 | 2.4 | PGMEA |
| Comp. Ex. 67 | HMDS | 4.8 | 30.2 | Sac | solid | 0.5 | 2.4 | PGMEA |
| Comp. Ex. 68 | HMDS | 4.8 | 30.2 | iOx | liquid | 0.2 | 2.4 | PGMEA |
| Comp. Ex. 69 | TMS-DMA | 3.5 | 30.2 | Im | solid | 0.2 | 2.4 | PGMEA |
| Comp. Ex. 70 | HMDS | 4.8 | 30.2 | Im | solid | 0.2 | 2.4 | PGMEA |
| Comp. Ex. 71 | TMS-Im | 4.2 | 30.2 | Im | solid | 0.2 | 2.4 | PGMEA |
| Comp. Ex. 72 | TDACP | 4.8 | 30.2 | Im | solid | 0.2 | 2.4 | PGMEA |
| Comp. Ex. 73 | HMCTS | 6.6 | 30.2 | Im | solid | 0.2 | 2.4 | PGMEA |
| Comp. Ex. 74 | HMDS | 4.8 | 30.2 | Tet | solid | 0.2 | 2.4 | PGMEA |
| Comp. Ex. 75 | HMDS | 4.8 | 30.2 | 5-MeTet | solid | 0.2 | 2.4 | PGMEA |
| Comp. Ex. 76 | HMDS | 4.8 | 30.2 | Tri | solid | 0.2 | 2.4 | PGMEA |
| Comp. Ex. 77 | HMDS | 4.8 | 30.2 | BzoTri | solid | 0.3 | 2.4 | PGMEA |
| Comp. Ex. 78 | HMDS | 4.8 | 30.2 | Pyr | solid | 0.2 | 2.4 | PGMEA |
| Comp. Ex. 79 | HMDS | 4.8 | 30.2 | 2-MeIm | solid | 0.2 | 2.4 | PGMEA |
| Comp. Ex. 80 | HMDS | 4.8 | 30.2 | 4-MeIm | solid | 0.2 | 2.4 | PGMEA |
| Comp. Ex. 81 | HMDS | 4.8 | 30.2 | TFAcIm | liquid | 0.4 | 2.4 | PGMEA |
| Comp. Ex. 82 | HMDS | 4.8 | 30.2 | 3-Mer-1,2,4-Tri | solid | 0.3 | 2.4 | PGMEA |
| Comp. Ex. 83 | HMDS | 4.8 | 30.2 | 5-MeBzoTri | solid | 0.3 | 2.4 | PGMEA |
| Comp. Ex. 84 | HMDS | 4.8 | 30.2 | 5-AminoTet | solid | 0.2 | 2.4 | PGMEA |
| Comp. Ex. 85 | HMDS | 4.8 | 30.2 | Tet-1-AcOH | solid | 0.3 | 2.4 | PGMEA |
| Comp. Ex. 86 | HMDS | 4.8 | 30.2 | Tet-5-AcOH | solid | 0.3 | 2.4 | PGMEA |
| Comp. Ex. 87 | HMDS | 4.8 | 30.2 | 5-Mer-1-MeTet | solid | 0.3 | 2.4 | PGMEA |
| Comp. Ex. 88 | HMDS | 4.8 | 30.2 | 5-BnTet | solid | 0.4 | 2.4 | PGMEA |
| Comp. Ex. 89 | HMDS | 4.8 | 30.2 | 5-PhTet | solid | 0.4 | 2.4 | PGMEA |
| Comp. Ex. 90 | HMDS | 4.8 | 30.2 | 5-pTolTet | solid | 0.4 | 2.4 | PGMEA |
| Comp. Ex. 91 | HMDS | 4.8 | 30.2 | 5-Mer-1-PhTet | solid | 0.4 | 2.4 | PGMEA |
| Comp. Ex. 92 | HMDS | 4.8 | 30.2 | 5-MeThiTet | solid | 0.3 | 2.4 | PGMEA |
| Comp. Ex. 93 | HMDS | 4.8 | 30.2 | Sac | solid | 0.5 | 2.4 | PGMEA |
| Comp. Ex. 94 | HMDS | 4.8 | 30.2 | iOx | liquid | 0.2 | 2.4 | PGMEA |

TABLE 3-continued

| | | Composition of Surface Treatment Agent | | | | | Evaluation Results | |
|---|---|---|---|---|---|---|---|---|
| | | (IV) | | | | Other Component | | |
| | | | Conc. of (IV) | | | | Amount | |
| | | | with respect to Total Amount of (I) to (IV) | | (IV)/(I) Molar | | [mass %] in Surface Treatment | (A) Dissolution | (B) Contact Angle |
| | Kind | [mass %] | [mmol/100 g] | Ratio | Kind | Agent | Time | [°] |
| Comp. Ex. 43 | TMS-Cl | 0.01 | 0.09 | 0.003 | none | — | ○ | 79 |
| Comp. Ex. 44 | | | | | | | ○ | 71 |
| Comp. Ex. 45 | | | | | | | ○ | 78 |
| Comp. Ex. 46 | | | | | | | ○ | 81 |
| Comp. Ex. 47 | | | | | | | ○ | 74 |
| Comp. Ex. 48 | | | | | | | X | 92 |
| Comp. Ex. 49 | | | | | | | X | 90 |
| Comp. Ex. 50 | | | | | | | X | 69 |
| Comp. Ex. 51 | | | | | | | Δ | 70 |
| Comp. Ex. 52 | | | | | | | Δ | 53 |
| Comp. Ex. 53 | | | | | | | X | 70 |
| Comp. Ex. 54 | | | | | | | Δ | 79 |
| Comp. Ex. 55 | | | | | | | ◎ | 83 |
| Comp. Ex. 56 | | | | | | | Δ | 81 |
| Comp. Ex. 57 | | | | | | | Δ | 77 |
| Comp. Ex. 58 | | | | | | | X | 86 |
| Comp. Ex. 59 | | | | | | | X | 57 |
| Comp. Ex. 60 | | | | | | | X | 91 |
| Comp. Ex. 61 | | | | | | | X | 88 |
| Comp. Ex. 62 | | | | | | | Δ | 92 |
| Comp. Ex. 63 | | | | | | | X | 90 |
| Comp. Ex. 64 | | | | | | | X | 89 |
| Comp. Ex. 65 | | | | | | | X | 89 |
| Comp. Ex. 66 | | | | | | | X | 92 |
| Comp. Ex. 67 | | | | | | | X | 89 |
| Comp. Ex. 68 | | | | | | | ◎ | 36 |
| Comp. Ex. 69 | TMS-TFA | 0.01 | 0.05 | 0.002 | none | — | ○ | 83 |
| Comp. Ex. 70 | | | | | | | ○ | 78 |
| Comp. Ex. 71 | | | | | | | ○ | 83 |
| Comp. Ex. 72 | | | | | | | ○ | 82 |
| Comp. Ex. 73 | | | | | | | ○ | 75 |
| Comp. Ex. 74 | | | | | | | X | 93 |
| Comp. Ex. 75 | | | | | | | X | 91 |
| Comp. Ex. 76 | | | | | | | X | 70 |
| Comp. Ex. 77 | | | | | | | Δ | 71 |
| Comp. Ex. 78 | | | | | | | Δ | 54 |
| Comp. Ex. 79 | | | | | | | X | 71 |
| Comp. Ex. 80 | | | | | | | Δ | 80 |
| Comp. Ex. 81 | | | | | | | ◎ | 83 |
| Comp. Ex. 82 | | | | | | | Δ | 82 |
| Comp. Ex. 83 | | | | | | | Δ | 78 |
| Comp. Ex. 84 | | | | | | | X | 87 |
| Comp. Ex. 85 | | | | | | | X | 58 |
| Comp. Ex. 86 | | | | | | | X | 92 |
| Comp. Ex. 87 | | | | | | | X | 89 |
| Comp. Ex. 88 | | | | | | | Δ | 92 |
| Comp. Ex. 89 | | | | | | | X | 91 |
| Comp. Ex. 90 | | | | | | | X | 90 |
| Comp. Ex. 91 | | | | | | | X | 90 |
| Comp. Ex. 92 | | | | | | | X | 93 |
| Comp. Ex. 93 | | | | | | | X | 90 |
| Comp. Ex. 94 | | | | | | | ◎ | 37 |

TABLE 4

| | Composition of Surface Treatment Agent | | | | | | | | |
|---|---|---|---|---|---|---|---|---|---|
| | (I) | | | (II) | | | | (III) | (IV) |
| | Kind | Conc. of (I) with respect to Total Amount of (I) to (IV) [mass %] | [mmol/100 g] | Kind | Form at 25° C. 1 atm | Conc. of (II) with respect to Total Amount of (I) to (IV) [mass %] | [mmol/100 g] | Organic Solvent | Kind |
| Ref. Ex. 2 | MSTFA | 6.0 | 30.2 | N-MeIm | liquid | 0.2 | 2.4 | PGMEA | none |
| Ex. 7 | MSTFA | 6.0 | 30.2 | N-MeIm | liquid | 0.2 | 2.4 | PGMEA | TMS-Cl |
| Ex. 8 | MSTFA | 6.0 | 30.2 | N-MeIm | liquid | 0.2 | 2.4 | PGMEA | |
| Ex. 2 | MSTFA | 6.0 | 30.2 | N-MeIm | liquid | 0.2 | 2.4 | PGMEA | |
| Ex. 9 | MSTFA | 6.0 | 30.2 | N-MeIm | liquid | 0.2 | 2.4 | PGMEA | |
| Ex. 10 | MSTFA | 6.0 | 30.2 | N-MeIm | liquid | 0.2 | 2.4 | PGMEA | |
| Ex. 11 | MSTFA | 6.0 | 30.2 | N-MeIm | liquid | 0.2 | 2.4 | PGMEA | |
| Ex. 12 | MSTFA | 6.0 | 30.2 | N-MeIm | liquid | 0.2 | 2.4 | PGMEA | |
| Ex. 13 | MSTFA | 6.0 | 30.2 | N-MeIm | liquid | 0.2 | 2.4 | PGMEA | TMS-TFA |
| Ex. 14 | MSTFA | 6.0 | 30.2 | N-MeIm | liquid | 0.2 | 2.4 | PGMEA | |
| Ex. 15 | MSTFA | 6.0 | 30.2 | N-MeIm | liquid | 0.2 | 2.4 | PGMEA | |
| Ex. 16 | MSTFA | 6.0 | 30.2 | N-MeIm | liquid | 0.2 | 2.4 | PGMEA | |
| Ex. 17 | MSTFA | 6.0 | 30.2 | N-MeIm | liquid | 0.2 | 2.4 | PGMEA | |
| Ref. Ex. 1 | MSTFA | 6.0 | 30.2 | Im | liquid | 0.2 | 2.4 | PGMEA | none |
| Ex. 18 | MSTFA | 6.0 | 30.2 | Im | liquid | 0.2 | 2.4 | PGMEA | TMS-TFA |
| Ex. 19 | MSTFA | 6.0 | 30.2 | Im | liquid | 0.2 | 2.4 | PGMEA | |
| Ex. 20 | MSTFA | 6.0 | 30.2 | Im | liquid | 0.2 | 2.4 | PGMEA | |
| Ex. 21 | MSTFA | 6.0 | 30.2 | Im | liquid | 0.2 | 2.4 | PGMEA | |
| Ex. 22 | MSTFA | 6.0 | 30.2 | Im | liquid | 0.2 | 2.4 | PGMEA | |
| Ref. Ex. 3 | MSTFA | 6.0 | 30.2 | N-EtIm | liquid | 0.2 | 2.4 | PGMEA | none |
| Ex. 23 | MSTFA | 6.0 | 30.2 | N-EtIm | liquid | 0.2 | 2.4 | PGMEA | TMS-TFA |
| Ex. 24 | MSTFA | 6.0 | 30.2 | N-EtIm | liquid | 0.2 | 2.4 | PGMEA | |
| Ex. 25 | MSTFA | 6.0 | 30.2 | N-EtIm | liquid | 0.2 | 2.4 | PGMEA | |
| Ex. 26 | MSTFA | 6.0 | 30.2 | N-EtIm | liquid | 0.2 | 2.4 | PGMEA | |
| Ex. 27 | MSTFA | 6.0 | 30.2 | N-EtIm | liquid | 0.2 | 2.4 | PGMEA | |
| Ref. Ex. 4 | MSTFA | 6.0 | 30.2 | N-BuIm | liquid | 0.3 | 2.4 | PGMEA | none |
| Ex. 28 | MSTFA | 6.0 | 30.2 | N-BuIm | liquid | 0.3 | 2.4 | PGMEA | TMS-TFA |
| Ex. 29 | MSTFA | 6.0 | 30.2 | N-BuIm | liquid | 0.3 | 2.4 | PGMEA | |
| Ex. 30 | MSTFA | 6.0 | 30.2 | N-BuIm | liquid | 0.3 | 2.4 | PGMEA | |
| Ex. 31 | MSTFA | 6.0 | 30.2 | N-BuIm | liquid | 0.3 | 2.4 | PGMEA | |
| Ex. 32 | MSTFA | 6.0 | 30.2 | N-BuIm | liquid | 0.3 | 2.4 | PGMEA | |
| Ref. Ex. 5 | MSTFA | 6.0 | 30.2 | TMS-Im | liquid | 0.3 | 2.4 | PGMEA | none |
| Ex. 6 | MSTFA | 6.0 | 30.2 | TMS-Im | liquid | 0.3 | 2.4 | PGMEA | TMS-TFA |
| Ex. 33 | MSTFA | 6.0 | 30.2 | TMS-Im | liquid | 0.3 | 2.4 | PGMEA | |
| Ex. 34 | MSTFA | 6.0 | 30.2 | TMS-Im | liquid | 0.3 | 2.4 | PGMEA | |
| Ex. 35 | MSTFA | 6.0 | 30.2 | TMS-Im | liquid | 0.3 | 2.4 | PGMEA | |
| Ex. 36 | MSTFA | 6.0 | 30.2 | TMS-Im | liquid | 0.3 | 2.4 | PGMEA | |
| Ex. 37 | MSTFA | 6.0 | 30.2 | N-MeIm | liquid | 0.2 | 2.4 | PGMEA | TMS-Cl |
| Ex. 38 | MSTFA | 6.0 | 30.2 | N-MeIm | liquid | 0.2 | 2.4 | PGMEA | TMS-TFA |
| Ex. 39 | MSTFA | 6.0 | 30.2 | N-MeIm | liquid | 0.2 | 2.4 | PGMEA | |
| Ref. Ex. 6 | MSTFA / BSTFA | 3.0 / 3.0 | 15.1 / 15.1 | N-MeIm | liquid | 0.2 | 2.4 | PGMEA | none |
| Ex. 40 | MSTFA / BSTFA | 3.0 / 3.0 | 15.1 / 15.1 | N-MeIm | liquid | 0.2 | 2.4 | PGMEA | TMS-Cl |
| Ex. 41 | MSTFA / BSTFA | 3.0 / 3.0 | 15.1 / 15.1 | N-MeIm | liquid | 0.2 | 2.4 | PGMEA | |
| Ex. 42 | MSTFA / BSTFA | 3.0 / 3.0 | 15.1 / 15.1 | N-MeIm | liquid | 0.2 | 2.4 | PGMEA | TMS-TFA |
| Ex. 43 | MSTFA / BSTFA | 3.0 / 3.0 | 15.1 / 15.1 | N-MeIm | liquid | 0.2 | 2.4 | PGMEA | |

| | Composition of Surface Treatment Agent | | | | Evaluation Results | |
|---|---|---|---|---|---|---|
| | (IV) | | | Other Component | | |
| | Conc. of (IV) with respect to Total Amount of (I) to (IV) [mass %] | [mmol/100 g] | (IV)/(I) Molar Ratio | Amount [mass %] in Surface Treatment Agent Kind | (A) Dissolution Time | (B) Contact Angle [°] |
| Ref. Ex. 2 | — | — | — | none — | ◉ | 94 |
| Ex. 7 | 0.001 | 0.01 | 0.0003 | | ◉ | 95 |
| Ex. 8 | 0.003 | 0.03 | 0.0009 | | ◉ | 96 |
| Ex. 2 | 0.01 | 0.09 | 0.003 | | ◉ | 97 |
| Ex. 9 | 0.1 | 0.9 | 0.03 | | ◉ | 97 |
| Ex. 10 | 1 | 9.2 | 0.3 | | ◉ | 97 |

TABLE 4-continued

| | | | | | | | |
|---|---|---|---|---|---|---|---|
| Ex. 11 | 3 | 27.6 | 0.9 | | | ◎ | 97 |
| Ex. 12 | 10 | 92.0 | 3.0 | | | ◎ | 97 |
| Ex. 13 | 0.01 | 0.05 | 0.002 | none | — | ◎ | 95 |
| Ex. 14 | 0.1 | 0.5 | 0.02 | | | ◎ | 97 |
| Ex. 15 | 1 | 5.4 | 0.2 | | | ◎ | 98 |
| Ex. 16 | 5 | 26.9 | 0.9 | | | ◎ | 98 |
| Ex. 17 | 10 | 53.7 | 1.8 | | | ◎ | 98 |
| Ref. Ex. 1 | — | — | — | none | — | ○ | 86 |
| Ex. 18 | 0.01 | 0.05 | 0.002 | | | ◎ | 87 |
| Ex. 19 | 0.1 | 0.5 | 0.02 | | | ◎ | 89 |
| Ex. 20 | 1 | 5.4 | 0.2 | | | ◎ | 90 |
| Ex. 21 | 5 | 26.9 | 0.9 | | | ◎ | 90 |
| Ex. 22 | 10 | 53.7 | 1.8 | | | ◎ | 90. |
| Ref. Ex. 3 | — | — | — | none | — | ◎ | 94 |
| Ex. 23 | 0.01 | 0.05 | 0.002 | | | ◎ | 95 |
| Ex. 24 | 0.1 | 0.5 | 0.02 | | | ◎ | 97 |
| Ex. 25 | 1 | 5.4 | 0.2 | | | ◎ | 98 |
| Ex. 26 | 5 | 26.9 | 0.9 | | | ◎ | 98 |
| Ex. 27 | 10 | 53.7 | 1.8 | | | ◎ | 98 |
| Ref. Ex. 4 | — | — | — | none | — | ◎ | 93 |
| Ex. 28 | 0.01 | 0.05 | 0.002 | | | ◎ | 94 |
| Ex. 29 | 0.1 | 0.5 | 0.02 | | | ◎ | 96 |
| Ex. 30 | 1 | 5.4 | 0.2 | | | ◎ | 97 |
| Ex. 31 | 5 | 26.9 | 0.9 | | | ◎ | 98 |
| Ex. 32 | 10 | 53.7 | 1.8 | | | ◎ | 98 |
| Ref. Ex. 5 | — | — | — | none | — | ◎ | 85 |
| Ex. 6 | 0.01 | 0.05 | 0.002 | | | ◎ | 88 |
| Ex. 33 | 0.1 | 0.5 | 0.02 | | | ◎ | 90 |
| Ex. 34 | 1 | 5.4 | 0.2 | | | ◎ | 90 |
| Ex. 35 | 5 | 26.9 | 0.9 | | | ◎ | 90 |
| Ex. 36 | 10 | 53.7 | 1.8 | | | ◎ | 90 |
| Ex. 37 | 0.01 | 0.09 | 0.003 | none | — | ◎ | 97 |
| | 0.01 | 0.05 | 0.002 | | | | |
| Ex. 38 | 0.1 | 0.9 | 0.03 | | | ◎ | 97 |
| | 0.1 | 0.5 | 0.02 | | | | |
| Ex. 39 | 1 | 9.2 | 0.3 | | | ◎ | 98 |
| | 1 | 5.4 | 0.2 | | | | |
| Ref. Ex. 6 | — | — | — | none | — | ◎ | 94 |
| Ex. 40 | 0.1 | 0.9 | 0.03 | none | — | ◎ | 97 |
| Ex. 41 | 1 | 9.2 | 0.3 | | | ◎ | 98 |
| Ex. 42 | 0.1 | 0.5 | 0.02 | none | — | ◎ | 97 |
| Ex. 43 | 1 | 5.4 | 0.2 | | | ◎ | 98 |

TABLE 5

| | Composition of Surface Treatment Agent | | | | | | | |
|---|---|---|---|---|---|---|---|---|
| | (I) | | | (II) | | | | |
| | | Conc. of (I) with respect to Total Amount of (I) to (IV) | | | Form at 25° C. | Conc. of (II) with respect to Total Amount of (I) to (IV) | | (III) | (IV) |
| | Kind | [mass %] | [mmol/100 g] | Kind | 1 atm | [mass %] | [mmol/100 g] | Organic Solvent | Kind |
| Ref. Ex. 7 | MSTFA | 6.0 | 30.2 | N-MeIm | liquid | 0.2 | 2.4 | PGMEA/THF-0.01 | none |
| Ex. 44 | MSTFA | 6.0 | 30.2 | N-MeIm | liquid | 0.2 | 2.4 | PGMEA/THF-0.01 | TMS-CI |
| Ex. 45 | MSTFA | 6.0 | 30.2 | N-MeIm | liquid | 0.2 | 2.4 | PGMEA/THF-0.01 | |
| Ex. 46 | MSTFA | 6.0 | 30.2 | N-MeIm | liquid | 0.2 | 2.4 | PGMEA/THF-0.01 | TMS-TFA |
| Ex. 47 | MSTFA | 6.0 | 30.2 | N-MeIm | liquid | 0.2 | 2.4 | PGMEA/THF-0.01 | |
| Ref. Ex. 8 | MSTFA | 6.0 | 30.2 | N-MeIm | liquid | 0.2 | 2.4 | PGMEA | none |
| Ex. 48 | MSTFA | 6.0 | 30.2 | N-MeIm | liquid | 0.2 | 2.4 | PGMEA | TMS-CI |
| Ex. 49 | MSTFA | 6.0 | 30.2 | N-MeIm | liquid | 0.2 | 2.4 | PGMEA | |
| Ex. 50 | MSTFA | 6.0 | 30.2 | N-MeIm | liquid | 0.2 | 2.4 | PGMEA | TMS-TFA |
| Ex. 51 | MSTFA | 6.0 | 30.2 | N-MeIm | liquid | 0.2 | 2.4 | PGMEA | |
| Ref. Ex. 9 | MSTFA | 6.0 | 30.2 | N-MeIm | liquid | 0.2 | 2.4 | PGMEA/THF-0.01 | none |
| Ex. 52 | MSTFA | 6.0 | 30.2 | N-MeIm | liquid | 0.2 | 2.4 | PGMEA/THF-0.01 | TMS-CI |
| Ex. 53 | MSTFA | 6.0 | 30.2 | N-MeIm | liquid | 0.2 | 2.4 | PGMEA/THF-0.01 | |

TABLE 5-continued

| | | | | | | | | | | |
|---|---|---|---|---|---|---|---|---|---|---|
| Ex. 54 | MSTFA | 6.0 | 30.2 | N-MeIm | liquid | 0.2 | 2.4 | PGMEA/THF-0.01 | TMS-TFA |
| Ex. 55 | MSTFA | 6.0 | 30.2 | N-MeIm | liquid | 0.2 | 2.4 | PGMEA/THF-0.01 | |
| Ex. 56 | MSTFA | 6.0 | 30.2 | N-MeIm | liquid | 0.2 | 2.4 | PGMEA/THF-0.01 | TMS-Cl TMS-TFA |
| Ex. 57 | MSTFA | 6.0 | 30.2 | N-MeIm | liquid | 0.2 | 2.4 | PGMEA/THF-0.01 | |
| Ex. 58 | MSTFA | 6.0 | 30.2 | N-MeIm | liquid | 0.2 | 2.4 | PGMEA/THF-0.01 | |
| Ref. Ex. 10 | MSTFA BSTFA | 3.0 3.0 | 15.1 15.1 | N-MeIm | liquid | 0.2 | 2.4 | PGMEA/THF-0.01 | none |
| Ex. 59 | MSTFA BSTFA | 3.0 3.0 | 15.1 15.1 | N-MeIm | liquid | 0.2 | 2.4 | PGMEA/THF-0.01 | TMS-Cl |
| Ex. 60 | MSTFA BSTFA | 3.0 3.0 | 15.1 15.1 | N-MeIm | liquid | 0.2 | 2.4 | PGMEA/THF-0.01 | |
| Ex. 61 | MSTFA BSTFA | 3.0 3.0 | 15.1 15.1 | N-MeIm | liquid | 0.2 | 2.4 | PGMEA/THF-0.01 | TMS-TFA |
| Ex. 62 | MSTFA BSTFA | 3.0 3.0 | 15.1 15.1 | N-MeIm | liquid | 0.2 | 2.4 | PGMEA/THF-0.01 | |

| | Composition of Surface Treatment Agent | | | | Evaluation Results | |
|---|---|---|---|---|---|---|
| | (IV) | | | Other Component | | |
| | Conc. of (IV) with respect to Total Amount of (I) to (IV) [mass %] | (IV)/(I) Molar Ratio [mmol/100 g] | | Kind | Amount [mass %] in Surface Treatment Agent | (A) Dissoluation Time | (B) Contact Angle [°] |
| Ref. Ex. 7 | — | — | — | none | — | ☺ | 94 |
| Ex. 44 | 0.1 | 0.9 | 0.03 | | | ☺ | 97 |
| Ex. 45 | 1 | 9.2 | 0.3 | | | ☺ | 97 |
| Ex. 46 | 0.1 | 0.5 | 0.02 | none | — | ☺ | 97 |
| Ex. 47 | 1 | 5.4 | 0.2 | | | ☺ | 98 |
| Ref. Ex. 8 | — | — | — | HPMDS | 0.1 | ☺ | 94 |
| Ex. 48 | 0.1 | 0.9 | 0.03 | | | ☺ | 97 |
| Ex. 49 | 1 | 9.2 | 0.3 | | | ☺ | 97 |
| Ex. 50 | 0.1 | 0.5 | 0.02 | HPMDS | 0.1 | ☺ | 97 |
| Ex. 51 | 1 | 5.4 | 0.2 | | | ☺ | 98 |
| Ref. Ex. 9 | — | — | — | HPMDS | 0.1 | ☺ | 94 |
| Ex. 52 | 0.1 | 0.9 | 0.03 | | | ☺ | 97 |
| Ex. 53 | 1 | 9.2 | 0.3 | | | ☺ | 97 |
| Ex. 54 | 0.1 | 0.5 | 0.02 | HPMDS | 0.1 | ☺ | 97 |
| Ex. 55 | 1 | 5.4 | 0.2 | | | ☺ | 98 |
| Ex. 56 | 0.01 0.01 | 0.09 0.05 | 0.003 0.002 | HPMDS | 0.1 | ☺ | 97 |
| Ex. 57 | 0.1 0.1 | 0.9 0.5 | 0.03 0.02 | | | ☺ | 97 |
| Ex. 58 | 1 1 | 9.2 5.4 | 0.3 0.2 | | | ☺ | 98 |
| Ref. Ex. 10 | — | — | — | HPMDS | 0.1 | ☺ | 94 |
| Ex. 59 | 0.1 | 0.9 | 0.03 | | | ☺ | 96 |
| Ex. 60 | 1 | 9.2 | 0.3 | | | ☺ | 97 |
| Ex. 61 | 0.1 | 0.5 | 0.02 | HPMDS | 0.1 | ☺ | 97 |
| Ex. 62 | 1 | 5.4 | 0.2 | | | ☺ | 98 |

In each of Examples 1 to 6, the dissolution time for preparation of the surface treatment agent was short within the range of 30 seconds or less; and the surface treatment agent had the effect of imparting high water repellency to the surface of the workpiece (wafer) as in the case of Reference Examples 1 to 5 in which the component (IV) was not used. As seen from comparison of Examples 1 to 6 with Reference Examples 1 to 5, the water repellency imparting effect was more enhanced by the addition of the component (IV) of the present disclosure.

The above-mentioned tendency was also confirmed in the respective Examples and the corresponding Reference Examples as shown in TABLES 4 and 5.

By contrast, the compositions of Comparative Examples 1 to 42 in each of which the component (II) was different from that of the surface treatment agent according to the present disclosure had the problem that: the insoluble component was left undissolved unless the raw materials were stirred for more than 30 seconds from the mixing (see Comparative Examples 1, 2, 4, 6, 7, 9, 10, 12 to 16, 18 to 20, 22, 23, 25, 27, 28, 30, 31, 33 to 37 and 39 to 41); the insoluble component was left and visually confirmed even after 1 hour of stirring of the raw materials from the mixing (see Comparative Examples 3, 11, 17, 24, 32 and 38); or the water repellency imparting effect was poor even though the dissolution time was short within the range of 30 seconds or less (see Comparative Examples 5, 8, 21, 26, 29 and 42). The compositions of these Comparative Examples were thus inferior to the surface treatment agent according to the present disclosure. (The components (II) used in Comparative Examples 1 to 42 respectively corresponded to "silicon-free nitrogen-containing heterocyclic compounds" used in the surface treatment agents of Examples 15, 16, 19 to 21, 34, 35 and 38 to 51 of Japanese Laid-Open Patent Application Publication No. 2017-063179.)

The compositions of Comparative Examples 43 to 47 and 69 to 73 in each of which the component (I) was different from that of the surface treatment agent according to the present disclosure (more specifically, which respectively corresponded to the surface treatment agents of Examples 1 to 9, 22 and 23 of Japanese Laid-Open Patent Application Publication No. 2017-063179) showed the result that the water repellency imparting effect was poor even though the dissolution time was short within the range of 30 seconds or less (see Comparative Examples 43 to 47 and 69 to 73). Thus, the compositions of these Comparative Examples were also inferior to the surface treatment agent according to the present disclosure.

The compositions of Comparative Examples 48 to 68 and 74 to 94 in each of which both of the components (I) and (II) were different from those of the surface treatment agent according to the present disclosure (more specifically, which respectively corresponded to the surface treatment agents of Examples 15, 16, 19 to 21, 34, 35 and 38 to 51 of Japanese Laid-Open Patent Application Publication No. 2017-063179) showed the result that the insoluble component was left undissolved unless the raw materials were stirred for more than 30 seconds from the mixing (see Comparative Examples 51, 52, 54, 56, 57, 62, 77, 78, 80, 82, 83 and 88); the insoluble component was left and visually confirmed even after 1 hour of stirring of the raw materials from the mixing (see Comparative Examples 48 to 50, 53, 58 to 61, 63 to 67, 74 to 76, 79, 84 to 87 and 89 to 93); or the water repellency imparting effect was poor even though the dissolution time was short (see Comparative Examples 55, 68, 81 and 94). Thus, the compositions of these Comparative Examples were also inferior to the surface treatment agent according to the present disclosure.

As shown in TABLE 1, the surface treatment agents of Examples 2 to 6 using as the component (II) N-MeIm, N-EtIm, N-BuIm and TMS-Im, each of which is liquid at 25° C. and 1.0 atmospheric pressure, had a very short dissolution time of 5 seconds or less as compared to the surface treatment agent of Example 1 using as the component (II) Im which is solid at 25° C. and 1.0 atmospheric pressure. The surface treatment agents of Examples 2 to 6 were more favorable from the viewpoint of shortening of the dissolution time of the raw materials. It has been shown that it is preferable to use at least one selected from the group consisting of N-MeIm, N-EtIm and N-BuIm as the component (II) from the viewpoint of water repellency imparting effect.

Further, it has been shown from TABLES 4 and 5 that: the contact angle of the protective film increases with increase in the molar ratio of the component (IV) to the component (I); and, when the molar ratio of the component (IV) to the component (I) increases to a certain high level, the contact angle of the protective film does not increase any more.

Example 63

MSTFA and trifluoroacetic anhydride (CF$_3$C(=O)—O—C(=O)CF$_3$; available from Tokyo Chemical Industry Co., Ltd.; hereinafter also referred to as "TFAA") as raw materials of the components (I) and (IV), N-MeIm as the component (II) and PGMEA as the component (III) were mixed together while the liquid temperature was maintained at 25° C. Among the above raw materials, a part of MSTFA and TFAA reacted quickly to form TMS-TFA as the component (I). There was thus obtained the surface treatment agent containing MSTFA as the component (I), N-MeIm as the component (II), PGMEA as the component (III) and TMS-TFA as the component (IV) at concentrations shown in TABLE 6. The thus-obtained surface treatment agent was in solution form where the whole raw materials were dissolved by stirring for 5 seconds or less. Subsequently, the surface treatment of a wafer with the surface treatment agent was performed in the same manner as in Example 1. The surface treated wafer was evaluated in the same manner as above.

Examples 64 and 67 to 71

The preparation of surface treatment agents was carried out in the same manner as in Example 63, except that the kinds and mass % concentrations of the raw material components (I) to (IV) and the other component of the surface treatment agent were varied. In each of the thus-obtained surface treatment agents, the respective components were contained at concentrations shown in TABLE 6. As shown in TABLE 6, TMS-Cl was additionally used as the component (IV) in Examples 69 to 71. Subsequently, the surface treatment of wafers with the surface treatment agents was performed in the same manner as in Example 1. The surface treated wafers were evaluated in the same manner as above.

Example 65

MSTFA and trifluoroacetic acid (CF$_3$C(=O)—OH; available from Tokyo Chemical Industry Co., Ltd.; hereinafter also referred to as "TFA") as raw materials of the components (I) and (IV), N-MeIm as the component (II) and PGMEA as the component (III) were mixed together while the liquid temperature was maintained at 25° C. Among the above raw materials, a part of MSTFA and TFA reacted quickly to form TMS-TFA as the component (I). There was thus obtained the surface treatment agent containing MSTFA as the component (I), N-MeIm as the component (II), PGMEA as the component (III) and TMS-TFA as the component (IV) at concentrations shown in TABLE 6. The thus-obtained surface treatment agent was in solution form where the whole raw materials were dissolved by stirring for 5 seconds or less. Subsequently, the surface treatment of a wafer with the surface treatment agent was performed in the same manner as in Example 1. The surface treated wafer was evaluated in the same manner as above.

Examples 66 and 72 to 76

The preparation of surface treatment agents was carried out in the same manner as in Example 65, except that the kinds and mass % concentrations of the raw material components (I) to (IV) and the other component of the surface treatment agent were varied. In each of the thus-obtained surface treatment agents, the respective components were contained at concentrations shown in TABLE 6. As shown in TABLE 6, TMS-Cl was additionally used as the component (IV) in Examples 74 to 76. Subsequently, the surface treatment of wafers with the surface treatment agents was performed in the same manner as in Example 1. The surface treated wafers were evaluated in the same manner as above.

TABLE 6

| | | Composition of Surface Treatment Agent | | | | | | | | | | | | | | | |
|---|---|---|---|---|---|---|---|---|---|---|---|---|---|---|---|---|---|
| | | (I) | | | (II) | | | | (III) | (IV) | | | | Other Component | | Evaluation Results | |
| | Raw Material Kind | Kind | Conc. of (I) with respect to Total Amount of (I) to (IV) [mass %] | [mmol/100 g] | Kind | Form at 25° C. 1 atm | Conc. of (II) with respect to Total Amount of (I) to (IV) [mass %] | [mmol/100 g] | Organic Solvent | Kind | Conc. of (IV) with respect to Total Amount of (I) to (IV) [mass %] | [mmol/100 g] | (IV)/(I) Molar Ratio | Kind | Amount [mass %] in Surface Treatment Agent | (A) Dissolution Time | (B) Contact Angle [°] |
| Ref. Ex. 2 | MSTFA | MSTFA | 6.0 | 30.1 | N-MeIm | liquid | 0.2 | 2.4 | PGMEA | none | — | — | — | none | — | ◎ | 94 |
| Ex. 63 | MSTFA TFAA | MSTFA | 6.0 | 30.1 | N-MeIm | liquid | 0.2 | 2.4 | PGMEA | TMS-TFA | 0.1 | 0.5 | 0.02 | | | ◎ | 97 |
| Ex. 64 | MSTFA TFAA | MSTFA | 6.0 | 30.1 | N-MeIm | liquid | 0.2 | 2.4 | PGMEA | TMS-TFA | 1 | 5.4 | 0.2 | | | ◎ | 98 |
| Ex. 65 | MSTFA TFA | MSTFA | 6.0 | 30.1 | N-MeIm | liquid | 0.2 | 2.4 | PGMEA | TMS-TFA | 0.1 | 0.5 | 0.02 | | | ◎ | 97 |
| Ex. 66 | MSTFA TFA | MSTFA | 6.0 | 30.1 | N-MeIm | liquid | 0.2 | 2.4 | PGMEA | TMS-TFA | 1 | 5.4 | 0.2 | | | ◎ | 98 |
| Ref. Ex. 9 | MSTFA | MSTFA | 6.0 | 30.1 | N-MeIm | liquid | 0.2 | 2.4 | PGMEA/THF-0.01 | none | — | — | — | HPMDS | 0.1 | ◎ | 94 |
| Ex. 67 | MSTFA TFAA | MSTFA | 6.0 | 30.1 | N-MeIm | liquid | 0.2 | 2.4 | PGMEA/THF-0.01 | TMS-TFA | 0.1 | 0.5 | 0.02 | | | ◎ | 96 |
| Ex. 68 | MSTFA TFAA | MSTFA | 6.0 | 30.1 | N-MeIm | liquid | 0.2 | 2.4 | PGMEA/THF-0.01 | TMS-TFA | 1 | 5.4 | 0.2 | | | ◎ | 97 |
| Ex. 69 | MSTFA TFAA | MSTFA | 6.0 | 30.1 | N-MeIm | liquid | 0.2 | 2.4 | PGMEA/THF-0.01 | TMS-TFA / TMS-Cl | 0.01 / 0.01 | 0.09 / 0.05 | 0.003 / 0.002 | | | ◎ | 97 |
| Ex. 70 | MSTFA TFAA | MSTFA | 6.0 | 30.1 | N-MeIm | liquid | 0.2 | 2.4 | PGMEA/THF-0.01 | TMS-TFA / TMS-Cl | 0.1 / 0.1 | 0.9 / 0.5 | 0.03 / 0.02 | | | ◎ | 97 |
| Ex. 71 | MSTFA TFAA | MSTFA | 6.0 | 30.1 | N-MeIm | liquid | 0.2 | 2.4 | PGMEA/THF-0.01 | TMS-TFA / TMS-Cl | 1 / 1 | 9.2 / 5.4 | 0.3 / 0.2 | | | ◎ | 98 |
| Ex. 72 | MSTFA TFA | MSTFA | 6.0 | 30.1 | N-MeIm | liquid | 0.2 | 2.4 | PGMEA/THF-0.01 | TMS-TFA | 0.1 | 0.5 | 0.02 | | | ◎ | 96 |
| Ex. 73 | MSTFA TFA | MSTFA | 6.0 | 30.1 | N-MeIm | liquid | 0.2 | 2.4 | PGMEA/THF-0.01 | TMS-TFA | 1 | 5.4 | 0.2 | | | ◎ | 97 |
| Ex. 74 | MSTFA TFA | MSTFA | 6.0 | 30.1 | N-MeIm | liquid | 0.2 | 2.4 | PGMEA/THF-0.01 | TMS-TFA / TMS-Cl | 0.01 / 0.01 | 0.09 / 0.05 | 0.003 / 0.002 | | | ◎ | 96 |
| Ex. 75 | MSTFA TFA | MSTFA | 6.0 | 30.1 | N-MeIm | liquid | 0.2 | 2.4 | PGMEA/THF-0.01 | TMS-TFA / TMS-Cl | 0.1 / 0.1 | 0.9 / 0.5 | 0.03 / 0.02 | | | ◎ | 96 |
| Ex. 76 | MSTFA TFA | MSTFA | 6.0 | 30.1 | N-MeIm | liquid | 0.2 | 2.4 | PGMEA/THF-0.01 | TMS-TFA / TMS-Cl | 1 / 1 | 9.2 / 5.4 | 0.3 / 0.2 | | | ◎ | 97 |

In each of Examples 63 to 76 in which the components (I) and (IV) were formed by using MSTFA and TFAA, or MSTFA and TFA, as the raw material compounds and reacting by mixing these raw material compounds, the dissolution time for preparation of the surface treatment agent was short within the range of 30 seconds or less; and the surface treatment agent had the effect of imparting high water repellency to the surface of the workpiece (wafer) as shown in TABLE 6. As seen from comparison of Examples 63 to 79 with the corresponding Reference Examples 2 and 9, the water repellency imparting effect was more enhanced by the addition of the component (IV) of the present disclosure as in the case of the above-mentioned Examples 1 to 62.

Examples 2-1 and 2-2

The surface treatment of wafers with surface treatment agents was performed in the same manner as in Example 2, except that the concentration of the component (II) was set to 15.0 mmol/100 g or 97.4 mmol/100 g with respect to the total amount of the components (I) to (IV) as shown in TABLE 7. The surface treated wafers were evaluated in the same manner as above. The results are shown in TABLE 7 and FIG. 1.

Comparative Examples 6-1 and 6-2

The surface treatment of wafers with surface treatment agents was performed in the same manner as in Comparative Example 6, except that the concentration of the component (II) was set to 15.0 mmol/100 g or 97.4 mmol/100 g with respect to the total amount of the components (I) to (IV) as shown in TABLE 7. The surface treated wafers were evaluated in the same manner as above. The results are shown in TABLE 7 and FIG. 1.

Comparative Examples 7-1 and 7-2

The surface treatment of wafers with surface treatment agents was performed in the same manner as in Comparative Example 7, except that the concentration of the component (II) was set to 15.0 mmol/100 g or 97.4 mmol/100 g with respect to the total amount of the components (I) to (IV) as shown in TABLE 7. The surface treated wafers were evaluated in the same manner as above. The results are shown in TABLE 7 and FIG. 1.

TABLE 7

| | Composition of Surface Treatment Agent | | | | | | | | |
|---|---|---|---|---|---|---|---|---|---|
| | (I) | | | (II) | | | | (III) | (IV) |
| | Kind | Conc. of (I) with respect to Total Amount of (I) to (IV) [mass %] | [mmol/100 g] | Kind | Form at 25° C. 1 atm | Conc. of (II) with respect to Total Amount of (I) to (IV) [mass %] | [mmol/100 g] | Organic Solvent | Kind |
| Ex. 2 | MSTFA | 6.0 | 30.2 | N-MeIm | liquid | 0.2 | 2.4 | PGMEA | TMS-Cl |
| Ex. 2-1 | | | | | | 1.2 | 15.0 | PGMEA | |
| Ex. 2-2 | | | | | | 8.0 | 97.4 | PGMEA | |
| Comp. Ex. 6 | MSTFA | 6.0 | 30.2 | 2-MeIm | solid | 0.2 | 2.4 | PGMEA | |
| Comp. Ex. 6-1 | | | | | | 1.2 | 15.0 | PGMEA | |
| Comp. Ex. 6-2 | | | | | | 8.0 | 97.4 | PGMEA | |
| Comp. Ex. 7 | MSTFA | 6.0 | 30.2 | 4-MeIm | solid | 0.2 | 2.4 | PGMEA | |
| Comp. Ex. 7-1 | | | | | | 1.2 | 15.0 | PGMEA | |
| Comp. Ex. 7-2 | | | | | | 8.0 | 97.4 | PGMEA | |

| | Composition of Surface Treatment Agent | | | | Evaluation Results | |
|---|---|---|---|---|---|---|
| | (IV) | | | Other Component | | |
| | Conc. of (IV) with respect to Total Amount of (I) to (IV) [mass %] | [mmol/100 g] | (IV)/(I) Molar Ratio | Amount [mass %] in Surface Treatment Agent — Kind | (A) Dissolution Time | (B) Contact Angle [°] |
| Ex. 2 | 0.01 | 0.09 | 0.003 | none — | ◎ | 97 |
| Ex. 2-1 | | | | | ◎ | 99 |
| Ex. 2-2 | | | | | ◎ | 100 |
| Comp. Ex. 6 | | 0.09 | 0.003 | | Δ | 83 |
| Comp. Ex. 6-1 | | | | | Δ | 83 |
| Comp. Ex. 6-2 | | | | | X | 83 |
| Comp. Ex. 7 | | 0.09 | 0.003 | | Δ | 90 |
| Comp. Ex. 7-1 | | | | | Δ | 90 |
| Comp. Ex. 7-2 | | | | | Δ | 87 |

In Examples 2, 2-1 and 2-2 in which N-MeIm was used as the component (II), there was seen a tendency that the contact angle increased to 97°, 99° and then to 100° as the concentration of the component (II) was increased to 2.4 mmol/100 g, 15.0 mmol/100 g and 97.4 mmol/100 g with respect to the total amount of the components (I) to (IV). Irrespective of such increase in the concentration of the component (II), the dissolution time was evaluated as being at a satisfactory level of ⊚ in each of these Examples. The evaluation results of the dissolution time are shown inside the parentheses adjacent to the respective plots in FIG. 1.

In Comparative Examples 6, 6-1 and 6-2 in which 2-MeIm was used as the component (II), by contrast, the contact angle remained unchanged at 83° even when the concentration of the component (II) was increased to 2.4 mmol/100 g, 15.0 mmol/100 g and 97.4 mmol/100 g with respect to the total amount of the components (I) to (IV). Further, the dissolution time was evaluated as Δ, Δ and × in these Comparative Examples. There was a tendency that the dissolution time was deteriorated with increase in the concentration of the component (II).

In Comparative Examples 7, 7-1 and 7-2 in which 4-MeIm was used as the component (II), the contact angle was 90°, 90° and 87° with almost no change even when the concentration of the component (II) was increased to 2.4 mmol/100 g, 15.0 mmol/100 g and 97.4 mmol/100 g with respect to the total amount of the components (I) to (IV). The dissolution time was evaluated as Δ (dissolution time: about 3 minutes), Δ (dissolution time: about 10 minutes) and Δ (dissolution time: about 30 minutes) in these Comparative Examples. There was also a tendency that the dissolution time was deteriorated with increase in the concentration of the component (II).

It has been shown from the above results that the surface treatment agent according to the present disclosure exhibits a good water repellency imparting effect over a wide range of the concentration of the component (II) with respect to the total amount of the components (I) to (IV) and can be prepared by dissolving the raw materials in a short time. It is therefore possible to freely select the concentration of the component (II) in the surface treatment agent according to the present disclosure. In particular, the concentration of the component (II) can be set within a suitable range which is higher than or equal to 0.05 mass % from the viewpoint of reaction promoting effect (by extension, water repellency imparting effect) and is lower than or equal to 10 mass % from the viewpoint of viewpoint of less likelihood of corrosion to the workpiece surface or impurity residue on the workpiece surface.

On the other hand, it has been shown that, in the case of using the nitrogen-containing heterocyclic compound that does not correspond to the component (II) of the present disclosure, the dissolution rate is inferior and is more deteriorated with increase in the concentration of the nitrogen-containing heterocyclic compound.

Examples 2D, 2D-1 and 2D-2

Figure 2:
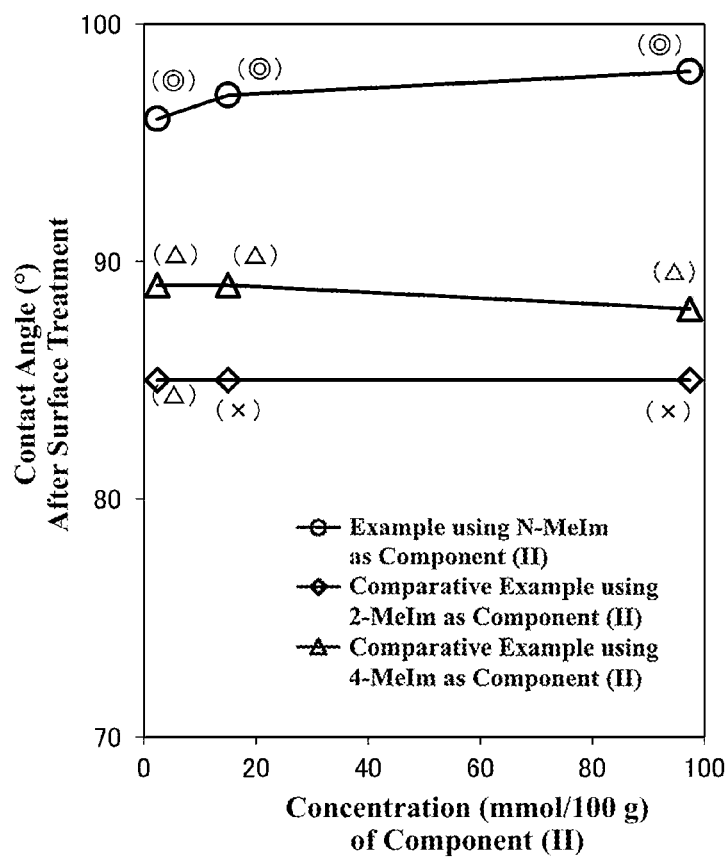
FIG. 2 is a diagram showing a plot of the contact angle after the surface treatment, relative to the concentration of the component (II) (in the case of using a mixed solvent of n-decane and TPGDME).

The surface treatment of wafers with surface treatment agents was performed in the same manner as in Examples 2, 2-1 and 2-2, respectively, except that n-decane/TPGDME-43 was used as the organic solvent component (III) as shown in TABLE 8. The surface treated wafers were evaluated in the same manner as above. The results are shown in TABLE 8 and FIG. 2. Herein, the term "n-decane/TPGDME-43" refers to a mixed solvent of n-decane (available from Tokyo Chemical Industry Co., Ltd.) and tripropylene glycol dimethyl ether (hereinafter also referred to as "TPGDME"; available from Tokyo Chemical Industry Co., Ltd.) in which the concentration of TPGDME was 43 mass % with respect to the total amount of the components (I) to (IV).

Comparative Examples 6D, 6D-1 and 6D-2

The surface treatment of wafers with surface treatment agents was performed in the same manner as in Comparative Examples 6, 6-1 and 6-2, respectively, except that n-decane/TPGDME-43 was used as the organic solvent as shown in TABLE 8. The surface treated wafers were evaluated in the same manner as above. The results are shown in TABLE 8 and FIG. 2.

Comparative Examples 7D, 7D-1 and 7D-2

The surface treatment of wafers with surface treatment agents was performed in the same manner as in Comparative Examples 7, 7-1 and 7-2, respectively, except that n-decane/TPGDME-43 was used as the organic solvent as shown in TABLE 8. The surface treated wafers were evaluated in the same manner as above. The results are shown in TABLE 8 and FIG. 2.

TABLE 8

| | Composition of Surface Treatment Agent | | | | | | | | |
|---|---|---|---|---|---|---|---|---|---|
| | (I) | | | (II) | | | | | |
| | | Conc. of (I) with respect to Total Amount of (I) to (IV) | | | Form at 25° C. | Conc. of (II) with respect to Total Amount of (I) to (IV) | | (III) | (IV) |
| | Kind | [mass %] | [mmol/100 g] | Kind | 1 atm | [mass %] | [mmol/100 g] | Organic Solvent | Kind |
| Ex. 2D | MSTFA | 6.0 | 30.2 | N-MeIm | liquid | 0.2 | 2.4 | n-Decane/TPGDME-43 | TMS-CI |
| Ex. 2D-1 | | | | | | 1.2 | 15.0 | n-Decane/TPGDME-43 | |
| Ex. 2D-2 | | | | | | 8.0 | 97.4 | n-Decane/TPGDME-43 | |
| Comp. Ex. 6D | MSTFA | 6.0 | 30.2 | 2-MeIm | solid | 0.2 | 2.4 | n-Decane/TPGDME-43 | |
| Comp. Ex. 6D-1 | | | | | | 1.2 | 15.0 | n-Decane/TPGDME-43 | |

TABLE 8-continued

| | | | | | | | | |
|---|---|---|---|---|---|---|---|---|
| Comp. Ex. 6D-2 | | | | | | 8.0 | 97.4 | n-Decane/TPGDME-43 |
| Comp. Ex. 7D | MSTFA | 6.0 | 30.2 | 4-MeIm | solid | 0.2 | 2.4 | n-Decane/TPGDME-43 |
| Comp. Ex. 7D-1 | | | | | | 1.2 | 15.0 | n-Decane/TPGDME-43 |
| Comp. Ex. 7D-2 | | | | | | 8.0 | 97.4 | n-Decane/TPGDME-43 |

| | Composition of Surface Treatment Agent | | | | Evaluation Results | |
|---|---|---|---|---|---|---|
| | (IV) | | | Other Component | | |
| | Conc. of (IV) with respect to Total Amount of (I) to (IV) | | (IV)/(I) Molar Ratio | Amount [mass %] in Surface Treatment Agent | (A) Dissolution Time | (B) Contact Angle [°] |
| | [mass %] | [mmol/100 g] | | Kind | | |
| Ex. 2D | 0.01 | 0.09 | 0.003 | none | — | ◎ | 96 |
| Ex. 2D-1 | | | | | | ◎ | 97 |
| Ex. 2D-2 | | | | | | ◎ | 98 |
| Comp. Ex. 6D | | 0.09 | 0.003 | | | Δ | 85 |
| Comp. Ex. 6D-1 | | | | | | X | 85 |
| Comp. Ex. 6D-2 | | | | | | X | 85 |
| Comp. Ex. 7D | | 0.09 | 0.003 | | | Δ | 89 |
| Comp. Ex. 7D-1 | | | | | | Δ | 89 |
| Comp. Ex. 7D-2 | | | | | | Δ | 88 |

In Examples 2D, 2D-1 and 2D-2 in which N-MeIm was used as the component (II), there was seen a tendency that the contact angle increased to 96°, 97° and then to 98° as the concentration of the component (II) was increased to 2.4 mmol/100 g, 15.0 mmol/100 g and 97.4 mmol/100 g with respect to the total amount of the components (I) to (IV). Irrespective of such increase in the concentration of the component (II), the dissolution time was evaluated as being at a satisfactory level of ◎ in each of these Examples. The evaluation results of the dissolution time are shown inside the parentheses adjacent to the respective plots in FIG. 1.

In Comparative Examples 6D, 6D-1 and 6D-2 in which 2-MeIm was used as the component (II), by contrast, the contact angle remained unchanged at 85° even when the concentration of the component (II) was increased to 2.4 mmol/100 g, 15.0 mmol/100 g and 97.4 mmol/100 g with respect to the total amount of the components (I) to (IV). Further, the dissolution time was evaluated as Δ, × and × in these Comparative Examples. There was a tendency that the dissolution time was deteriorated with increase in the concentration of the component (II).

In Comparative Examples 7D, 7D-1 and 7D-2 in which 4-MeIm was used as the component (II), the contact angle was 89°, 89° and 88° with almost no change even when the concentration of the component (II) was increased to 2.4 mmol/100 g, 15.0 mmol/100 g and 97.4 mmol/100 g with respect to the total amount of the components (I) to (IV). The dissolution time was evaluated as Δ (dissolution time: about 5 minutes), Δ (dissolution time: about 15 minutes) and Δ (dissolution time: about 50 minutes) in these Comparative Examples. There was also a tendency that the dissolution time was deteriorated with increase in the concentration of the component (II).

Herein, the dissolution time was longer in each of Comparative Examples 7D, 7D-1 and 7D-2 in which "decane/TPGDME-4" containing nonpolar n-decane was used as the organic solvent as compared to the above-mentioned Comparative Examples 7, 7-1 and 7-2 in which PGMEA was used as the organic solvent. It can thus be said that the amount of the nonpolar solvent used in the organic solvent is preferably as small as possible from the viewpoint of the solubility of the components (III) and (IV).

The above-mentioned tendency was also confirmed in the other Examples and Comparative Examples.

It has thus been shown that, in the case of using the nitrogen-containing heterocyclic compound that does not correspond to the component (II) of the present disclosure, the dissolution rate is inferior and is more deteriorated with increase in the concentration of the nitrogen-containing heterocyclic compound even when "decane/TPGDME-4" containing nonpolar n-decane was used as the organic solvent. As seen from comparison of TABLE 7 and TABLE 8 and comparison of FIG. 1 and FIG. 2, the dissolution rate tends to be more deteriorated with change of the organic solvent from the polar PGMEA solvent to "decane/TPGDME-43" solvent containing nonpolar n-decane.

On the other hand, it has been shown that the surface treatment agent according to the present disclosure exhibits a good water repellency imparting effect over a wide range of the concentration of the component (II) with respect to the total amount of the components (I) to (IV) and can be prepared by dissolving the raw materials in a short time even when "decane/TPGDME-4" containing nonpolar n-decane was used as the organic solvent. It is therefore possible to freely select the concentration of the component (II) in the surface treatment agent according to the present disclosure. In particular, the concentration of the component (II) can be set within a suitable range which is higher than or equal to 0.05 mass % from the viewpoint of reaction promoting effect (by extension, water repellency imparting effect) and is lower than or equal to 10 mass % from the viewpoint of viewpoint of less likelihood of corrosion to the workpiece surface or impurity residue on the workpiece surface.

As described above, the surface treatment agent according to the present disclosure is advantageous in that: the surface treatment agent exerts a good water repellency imparting effect without largely depending on the polarity of the organic solvent; and, during preparation of the surface treatment agent, the raw materials are dissolved in a short time.

The invention claimed is:

1. A surface treatment agent for surface treatment of a workpiece, comprising the following components:
   (I) at least one kind selected from the group consisting of silicon compounds represented by the following general formulas [1] and [2];
   (II) at least one kind selected from the group consisting of a nitrogen-containing heterocyclic compound represented by the following general formula [3], a nitrogen-containing heterocyclic compound represented by the following general formula [4] and imidazole;
   (III) an organic solvent; and
   (IV) at least one kind selected from the group consisting of silicon compound represented by the following general formulas [5] and [6]

$$(R^1)_a(H)_b Si[N(R^2)C(=O)R^3]_{4-a-b} \quad [1]$$

where $R^1$ is each independently a $C_1$-$C_{18}$ monovalent hydrocarbon group in which a part or all of hydrogen atoms may be substituted by a fluorine atom; $R^2$ is each independently a group selected from the group consisting of a $C_1$-$C_6$ alkyl group in which a part or all of hydrogen atoms may be substituted by a fluorine atom, and a hydrogen atom; $R^3$ is each independently a $C_1$-$C_6$ alkyl group in which a part or all of hydrogen atoms may be substituted by a fluorine atom; a is an integer of 1 to 3; b is an integer of 0 to 2; and the sum of a and b is 1 to 3, $$(R^4)_c(H)_d Si[OC(R^5)=NSi(R^6)_e(H)_{3-e}]_{4-c-d} \quad [2]$$

where $R^4$ and $R^6$ are each independently a $C_1$-$C_{18}$ monovalent hydrocarbon group in which a part or all of hydrogen atoms may be substituted by a fluorine atom; $R^5$ is each independently a group selected from the group consisting of a $C_1$-$C_6$ alkyl group in which a part or all of hydrogen atoms may be substituted by a fluorine atom, and a hydrogen atom; c is an integer of 1 to 3; d is an integer of 0 to 2; e is an integer of 1 to 3; and the sum of c and d is 1 to 3,

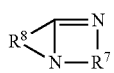  [3]

where $R^7$ and $R^8$ are each independently a divalent organic group consisting of carbon and/or nitrogen and hydrogen, in which the total number of carbon and nitrogen atoms is 1 to 9; and, in the case where the total number of carbon and nitrogen atoms is 2 or greater, there may exit a carbon atom that does not form a ring,

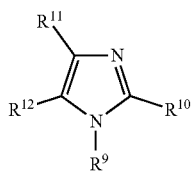  [4]

where $R^9$ is a $C_1$-$C_6$ alkyl group in which a part of all of hydrogen atoms may be substituted by a fluorine atom, a trialkylsilyl group having a $C_1$-$C_8$ alkyl group in which a part of all of hydrogen atoms may be substituted by a fluorine atom, a $C_2$-$C_6$ alkenyl group in which a part of all of hydrogen atoms may be substituted by a fluorine atom, a $C_1$-$C_6$ alkoxy group in which a part of all of hydrogen atoms may be substituted by a fluorine atom, an amino group, an alkylamino group having a $C_1$-$C_6$ alkyl group in which a part of all of hydrogen atoms may be substituted by a fluorine atom, a dialkylamino group having a $C_1$-$C_6$ alkyl group in which a part of all of hydrogen atoms may be substituted by a fluorine atom, a $C_1$-$C_6$ aminoalkyl group in which a part of all of hydrogen atoms may be substituted by a fluorine atom, a nitro group, a cyano group, a phenyl group, a benzyl group, or a halogen atom; and $R^{10}$, $R^{11}$ and $R^{12}$ are each independently a $C_1$-$C_6$ alkyl group in which a part or all of hydrogen atoms may be substituted by a fluorine atom, or a hydrogen atom, $$(R^{13})_f(H)_g Si[OC(=O)R^{14}]_{4-f-g} \quad [5]$$

where $R^{13}$ is each independently a $C_1$-$C_{18}$ monovalent hydrocarbon group in which a part or all of hydrogen atoms may be substituted by a fluorine atom; $R^{14}$ is each independently a $C_1$-$C_6$ alkyl group in which a part or all of hydrogen atoms may be substituted by a fluorine atom; f is an integer of 1 to 3; g is an integer of 0 to 2; and the sum of f and g is 1 to 3, $$(R^{15})_h(H)_i SiX_{4-h-i} \quad [6]$$

where $R^{15}$ is each independently a $C_1$-$C_{18}$ monovalent hydrocarbon group in which a part or all of hydrogen atoms may be substituted by a fluorine atom; X is each independently a halogen atom, an alkylsulfonate group, or a perfluoroalkylsulfonate group; h is an integer of 1 to 3; i is an integer of 0 to 2; and the sum of h and i is 1 to 3.

2. The surface treatment agent according to claim 1, wherein an amount of the component (IV) contained relative to the amount of the component (I) is more than or equal to 0.001 and less than 1 in terms of molar ratio.

3. The surface treatment agent according to claim 1, wherein the component (IV) comprises at least one kind of silicon compound represented by the general formula [5] in which f is 3; and $R^{14}$ is a $C_1$-$C_6$ fluorine-containing alkyl group.

4. The surface treatment agent according to claim 1, wherein the component (IV) comprises $(CH_3)_3SiOC(=O)CF_3$.

5. The surface treatment agent according to claim 1, wherein the component (IV) comprises a silicon compound represented by the general formula [6] in which h is 3; i is 0; and $R^{15}$ is a $C_1$-$C_6$ alkyl group or a $C_1$-$C_6$ fluorine-containing alkyl group.

6. The surface treatment agent according to claim 1, wherein the component (IV) comprises a silicon compound represented by the general formula [6] in which X is a chlorine atom.

7. The surface treatment agent according to claim 1, wherein the component (IV) comprises $(CH_3)_3SiCl$.

8. The surface treatment agent according to claim 1, wherein a concentration of the component (II) is 0.05 to 10 mass % with respect to a total amount of the components (I) to (IV).

9. The surface treatment agent according to claim 1, wherein the component (II) is liquid at 25° C. and 1.0 atmospheric pressure.

10. The surface treatment agent according to claim 1, wherein, in the general formula [4], $R^9$ is a $C_1$-$C_4$ alkyl group or a trimethylsilyl group, and $R^{10}$, $R^{11}$ and $R^{12}$ are hydrogen atoms, respectively.

11. The surface treatment agent according to claim 1, wherein the component (II) is at least one selected from the group consisting of N-methylimidazole, N-ethylimidazole, N-propylimidazole, N-butylimidazole and trimethylsilylimidazole.

12. The surface treatment agent according to claim 1, wherein the concentration of the component (I) is 0.1 to 35 mass % with respect to the total amount of the components (I) to (IV).

13. The surface treatment agent according to claim 1, wherein the component (I) comprises at least one kind of silicon compound represented by the general formula [1] in which a is 3; $R^2$ is a methyl group; and $R^3$ is a $C_1$-$C_6$ fluorine-containing alkyl group.

14. The surface treatment agent according to claim 1, wherein the component (I) comprises $(CH_3)_3SiN(CH_3)C(=O)CF_3$.

15. The surface treatment agent according to claim 1, wherein the component (I) comprises at least one kind of silicon compound represented by the general formula [2] in which c and e are each 3; and $R^5$ is a methyl group or a trifluoromethyl group.

16. The surface treatment agent according to claim 1, wherein the component (I) comprises $(CH_3)_3SiOC(CF_3)=NSi(CH_3)_3$.

17. The surface treatment agent according to claim 1, wherein the organic solvent is an aprotic solvent.

18. A method for manufacturing a surface treated body, comprising bringing the surface treatment agent according to claim 1 into contact with a surface of a workpiece and thereby surface treating the workpiece.

* * * * *